United States Patent
Leon et al.

(10) Patent No.: US 9,575,515 B2
(45) Date of Patent: Feb. 21, 2017

(54) FABRIC LAMINATION TO A COMPONENT

(71) Applicant: Microsoft Technology Licensing, LLC, Redmond, WA (US)

(72) Inventors: Camilo Leon, Redmond, WA (US); Kabir Siddiqui, Sammamish, WA (US); Dane M. Hansen, Marysville, WA (US); Anthony Christian Reed, Sammamish, WA (US); Matthew David Mickelson, Seattle, WA (US); Jiannan Chen, Sammamish, WA (US); Rahul Marwah, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 70 days.

(21) Appl. No.: 14/451,146

(22) Filed: Aug. 4, 2014

(65) Prior Publication Data
US 2015/0346780 A1 Dec. 3, 2015

Related U.S. Application Data

(60) Provisional application No. 62/006,635, filed on Jun. 2, 2014.

(51) Int. Cl.
| | |
|---|---|
| *A47B 96/06* | (2006.01) |
| *H05K 7/00* | (2006.01) |
| *H05K 5/00* | (2006.01) |
| *G06F 1/16* | (2006.01) |
| *H05K 5/02* | (2006.01) |

(Continued)

(52) U.S. Cl.
CPC ............ *G06F 1/1681* (2013.01); *F16M 11/10* (2013.01); *F16M 13/00* (2013.01); *G06F 1/163* (2013.01); *G06F 1/166* (2013.01); *G06F 1/1626* (2013.01); *G06F 1/1637* (2013.01); *H05K 5/0226* (2013.01); *H05K 13/0023* (2013.01);
(Continued)

(58) Field of Classification Search
CPC ...................................................... G06F 1/1616
USPC .................................................... 361/679.01
See application file for complete search history.

(56) References Cited

U.S. PATENT DOCUMENTS

| | | |
|---|---|---|
| 5,870,282 A | 2/1999 | Andreet et al. |
| 2011/0036965 A1 | 2/2011 | Zhang et al. |

(Continued)

FOREIGN PATENT DOCUMENTS

WO WO-2013158110 10/2013

OTHER PUBLICATIONS

"Seidio Surface Case (with kickstand) for Samsung Galaxy S4", Retrieved from: <http://www.shopandroid.com/seidio-surface-case-with-kickstand/4A123A14149.htm> on Apr. 9, 2014, 2 pages.

(Continued)

*Primary Examiner* — Jerry Wu
(74) *Attorney, Agent, or Firm* — Qudus Olaniran; Judy Yee; Micky Minhas

(57) ABSTRACT

Techniques for fabric lamination to a component are described. According to various implementations, a single piece of fabric is laminated to a moveable component and to an apparatus to which the moveable component is attached. Generally, lamination of fabric to a moveable component and portions of an associated apparatus can enhance a user experience in a variety of ways. Embodiments may also be employed to cut fabric from around a surface component of an apparatus.

20 Claims, 19 Drawing Sheets

(51) Int. Cl.
    *H05K 13/00* (2006.01)
    *F16M 11/10* (2006.01)
    *F16M 13/00* (2006.01)
(52) U.S. Cl.
    CPC ..... *G06F 2200/1633* (2013.01); *Y10T 16/525* (2015.01); *Y10T 156/1052* (2015.01)

(56) References Cited

U.S. PATENT DOCUMENTS

| | | | | |
|---|---|---|---|---|
| 2012/0267402 | A1* | 10/2012 | Beatty | A45F 3/14 224/218 |
| 2013/0229100 | A1 | 9/2013 | Siddiqui et al. | |
| 2014/0131251 | A1* | 5/2014 | Westrup | A45C 11/00 206/756 |

OTHER PUBLICATIONS

"August Lion® Premium Thin PU Leather Smart Case Cover for Apple iPad Air—Light Blue", Retrieved from: <http://www.amazon.com/dp/B00GMG3GN4?psc=1> on Apr. 15, 2014, 3 pages.

"Incipio Slim Kickstand iPad 3 Case", Available at: http://gadgetsin.com/incipio-slim-kickstand-ipad-3-case.htm, Apr. 10, 2012, 3 pages.

"ZAGGkeys Mini 7", Retrieved from: <http://www.gamestop.ie/Other%20Products/Games/45659> on Apr. 14, 2014, 4 pages.

"ZAGGkeys PROfolio+ Keyboard Case Cover for iPad 2/3/4", Retrieved from: <http://www.amazon.com/ZAGGkeys-PROfolio-Keyboard-Case-Cover/dp/B00AI3RRAA/ref=sr_1_6s=pc&ie=UTF8&qid=1397533796&sr=1-6> on Apr. 15, 2014, 5 pages.

"Bear Motion Luxury 100 Percent Full Grain Genuine Top Layer Buffalo Hide Vintage Leather Case for IPad Tablets, Diamond Black", Retrieved from: <http://www.amazon.com/Bear-Motion-Percent-Genuine-Buffalo/dp/B0093WMUI6/ref=sr_1_54?s=pc&ie=UTF8&qid=1397534285&sr=1-54> on Apr. 15, 2014, 5 pages.

Cohen, "Wrap Your iPad in Leather with the Twelve South SurfacePad", Available at: http://geardiary.com/2014/03/11/wrap-ipad-leather-twelve-south-surfacepad/, Mar. 11, 2014, 7 pages.

Colander, "Introduction and Specifications", Available at: http://hothardware.com/printarticle.aspx?articleid=2110, Nov. 14, 2013, 12 pages.

Cole, "Logitech, Belkin unveil new keyboard accessories for Apple's iPad Air", Available at: http://appleinsider.com/articles/13/10/28/logitech-belkin-unveil-new-keyboard-accessories-for-apples-ipad-air, Oct. 28, 2013, 10 pages.

Seghers, "Asus/Google Nexus 7 Accessories Arrive, Keyboard Folio in Tow", Available at: http://www.trustedreviews.com/news/asus-google-nexus-7-accessories-arrive-keyboard-folio-in-tow, Aug. 21, 2012, 9 pages.

"International Search Report and Written Opinion", Application No. PCT/US2015/033096, Aug. 21, 2015, 10 Pages.

"Second Written Opinion", Application No. PCT/US2015/033096, Mar. 18, 2016, 8 pages.

"International Preliminary Report on Patentability", Application No. PCT/US2015/033096, Jun. 13, 2016, 9 pages.

* cited by examiner

FABRIC LAMINATION TO A COMPONENT

RELATED APPLICATION

This application claims priority under 35 U.S.C. §119(e) to U.S. Provisional Patent Application No. 62/006,635, entitled "Fabric Lamination to a Component" and filed on Jun. 2, 2014, the disclosure of which is incorporated in its entirety by reference herein.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for fabric lamination to a component are described. According to various embodiments, a single piece of fabric is laminated to a moveable component and to an apparatus to which the moveable component is attached. Generally, lamination of fabric to a moveable component and portions of an associated apparatus can enhance a user experience in a variety of ways. Embodiments may also be employed to cut fabric from around a surface component of an apparatus.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
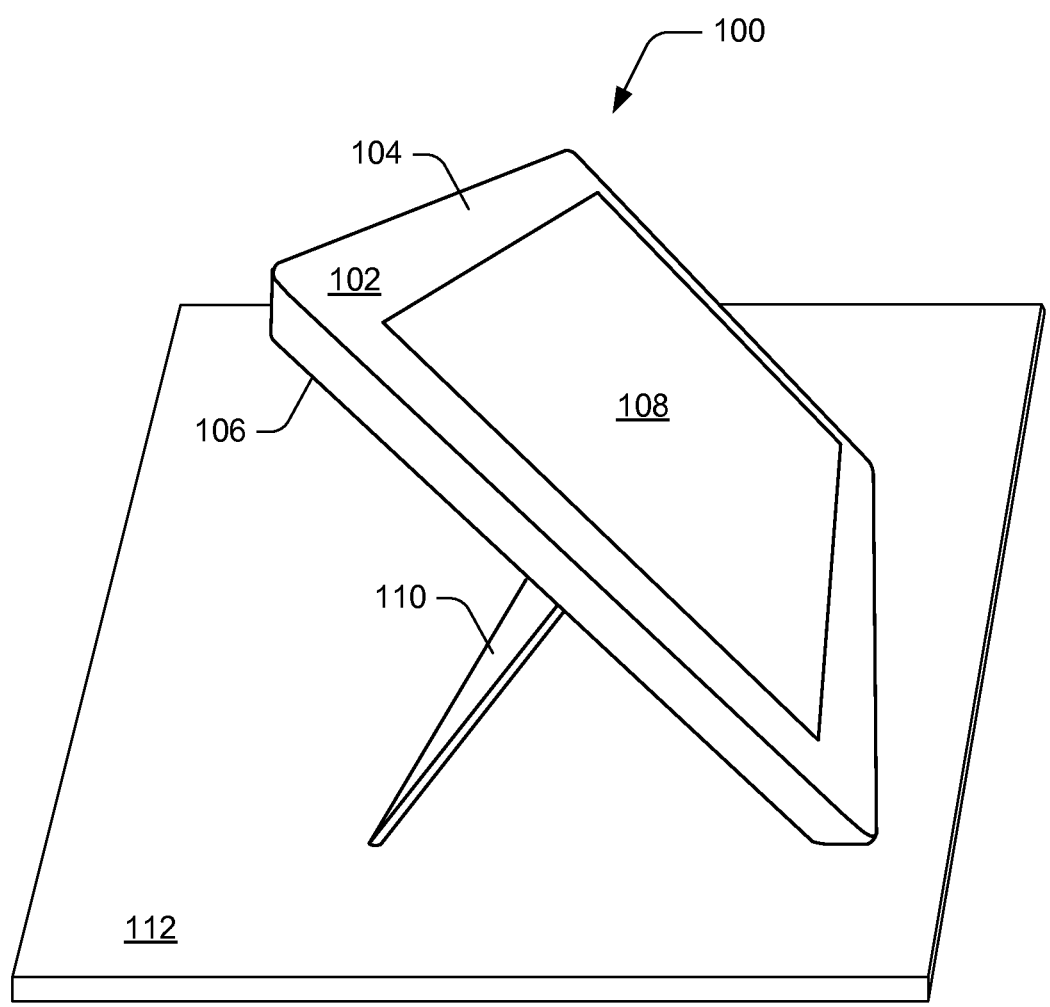
FIG. 1 is an illustration of an example device that is operable to employ techniques described herein in accordance with one or more embodiments.

Techniques for fabric lamination to a component are described. In at least some implementations, a moveable component is implemented as a support component for a computing device. For instance, the moveable component can serve as a "kickstand" that is attached to a computing device and that can be positioned to support the computing device in a variety of orientations relative to an adjacent surface. This is not intended to be limiting, however, and the moveable component can be implemented in a variety of different ways. For instance, the moveable component can include any suitable type of moveable and/or articulating component.

According to various implementations, a single piece of fabric is laminated to a moveable component and to an apparatus to which the moveable component is attached. Generally, lamination of fabric to a moveable component and portions of an associated apparatus can enhance a user experience in a variety of ways. For instance, consider a device that may be used in handheld scenarios, such as a tablet computer, and smartphone, and so forth. Typically, a chassis of such as device is fabricated from a rigid material, such as metal, metal alloys, plastic, and so forth. Laminating the chassis with fabric enables a more comfortable handheld user experience than a metallic or plastic material. Further, fabric may be less slippery and thus reduce the likelihood that a device will slip from a user's hand and be dropped.

Fabric lamination may also dampen vibration of components of a device. For instance, fabric may absorb and/or disperse vibrations, such as during movement of a moveable component. This can reduce noise caused by vibrations that may occur during movement of a moveable component. This may also decrease user annoyance and discomfort that may result from physically perceptible vibrations.

Fabric may also aid in heat dissipation. For instance, devices often produce heat, such as from operation of various electrical components. Thus, a fabric layer may absorb heat and enable heat to be dissipated over a larger surface, thus reducing hotspots and aiding in device cooling.

According to one or more implementations, techniques can be employed to cut a fabric layer around a surface component of a device. For instance, a device may include an input functionality on a particular surface, such as a touch pad. The surface may be laminated with fabric, and thus implementations may be employed to cut the fabric from around the touch pad to enable the touch pad to be exposed for receiving user input.

In the following discussion, an example device is first described that may employ the techniques described herein. Implementations discussed herein, however, are not limited to the example device. Next, a section titled "Example Orientations" describes some example device orientations in accordance with one or more implementations. Following this, a section titled "Example Fabrication Scenarios" describes example implementation scenarios for fabric lamination to a component in accordance with one or more implementations. Next, a section titled "Example Procedures" describes some example methods for fabric lamination to a component in accordance with one or more implementations. Finally, an example system and device are discussed that may implement various techniques described herein.

Example Device

FIG. 1 is an illustration of a computing device 100 which may be configured according to techniques for fabric lamination to a component discussed herein. In this particular example, the computing device 100 is configured as a tablet computing device. This is not intended to be limiting, however, and the computing device 100 may be configured in a variety of other ways, such as a mobile phone, a wearable device, a desktop computing device, a gaming apparatus, and so on.

Thus, the computing device 100 may range from full resource devices with substantial memory and processor resources to a low-resource device with limited memory and/or processing resources. The computing device 100 is operably associated with software that causes the computing device 100 to perform one or more operations. An example implementation of the computing device 100 is discussed below with reference to FIG. 23. Please note that the computing device 100 and its various components illustrated in the accompanying figures are not necessarily illustrated to scale.

The computing device 100 includes a chassis 102 with a front surface 104 and a rear surface 106. Generally, the chassis 102 is representative of a main supporting structure of the computing device 100. The chassis 102 may be constructed from various types and/or combinations of materials, such as plastics, metals, alloys, fiber composites, and so forth. Various components of the computing device 100 may be attached to the chassis 102, such as to internal and/or external surfaces of the chassis 102.

Disposed on the front surface 104 is a display device 108, which is representative of functionality to provide visual output for the computing device 100. Disposed on the rear surface 106 is a support component 110 that enables various operating positions for the computing device 100, such as relative to an adjacent surface 112. Generally, the support component 110 is formed via a planar portion of material, such as instances and/or combinations of plastic, metal, various alloys, carbon fiber, and so forth.

As further detailed herein, the support component 110 is adjustably attached to the rear surface 106 such that the support component 110 may be moved to different positions relative to the rear surface 106. In at least some implementations, this enables the support component 110 to be closed to support handheld usage of the computing device 100. As illustrated in FIG. 1, the support component 110 may also be opened such that the computing device 100 may recline on the surface 112 and be supported at least partially by the support component 110. For instance, the support component 110 enables the computing device 100 to recline against an adjacent surface, such as a desk, a table, a user's lap, and so forth.

In at least some implementations, the support component 110 includes multiple preset open positions that enable different reclining angles, e.g., different angles of the front surface 104 relative to the surface 112. The support component 110, for instance, is attached to the computing device 100 via a hinge mechanism that enables movement of the support component 110 relative to the rear surface 106. The hinge mechanism may include a closed position that enables the support component 110 to be placed in a closed position. The hinge mechanism may further include one or more preset open positions that enable the support component 110 to be placed in one or more open positions to support different operating positions of the computing device 100. Further details concerning a hinge mechanism and different operating positions of the computing device 100 are presented below.

According to various implementations, portions of the outer surface of the computing device 100 are covered in fabric. For instance, the rear surface 106 and the support component 110 may be coated in fabric. In at least some implementations, all external surfaces of the computing device 100 with the exception of the display device 108 and any openings for cable and/or peripheral attachment may be covered in fabric. Generally, the fabric is representative of a flexible material that may be laminated to outer surfaces of the computing device 100. Examples of a suitable fabric include fabrics made from natural materials (e.g., cotton, silk, wool, linen, and so forth), fabrics made from synthetic materials (e.g., nylon, polyester, aramid, carbon fiber, and so forth), and combinations thereof. These examples are not to be construed as limiting, and a variety of other types and instances of fabrics may be employed in accordance with the claimed implementations.

While not expressly illustrated herein, the computing device 100 may be configured to enable removable attachment of various peripheral devices to the computing device 100. Examples of such peripheral devices include input devices, such as a keyboard, a game controller, a music input device (e.g., a digital piano keyboard), and so forth. Removable attachment may be accomplished in a variety of ways, such as via magnetic attachment, connector attachment, clip attachment, and so forth.

Have introduced the computing device 100, consider now a discussion of some example orientations of the computing device 100 in accordance with one or more implementations.

Example Orientations

Figure 2:
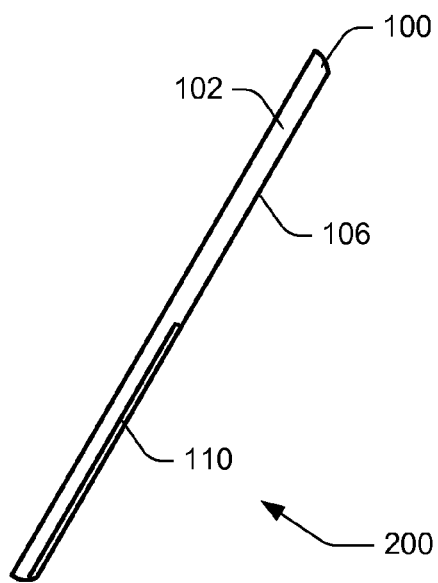
FIG. 2 depicts an example orientation a support component in a closed position in accordance with one or more embodiments.

FIG. 2 illustrates a side view of the computing device 100 in which the support component 110 is in a closed position 200. In the closed position 200, the support component 110 forms a portion of a rear surface 106 of the computing device 100 such that the support component 110 conforms to a surface contour of the computing device 100. For instance, when the support component 110 is in the closed position 200, the support component 110 integrates into the chassis 102 and does not protrude from a plane formed by the rear surface 106. Generally, the closed position 200 supports various usage scenarios for the computing device 100, such as handheld usage of the computing device 100.

While the support component 110 is illustrated in the closed position 200 as being visible from a side view of the computing device 100, this is not intended to be limiting. For instance, as illustrated in some of the accompanying figures, in some implementations the support component 110 is positioned within a cutout portion of the rear surface 106 that includes a border that surrounds the support component 110 when the support component 110 is in a closed position.

Figure 3:
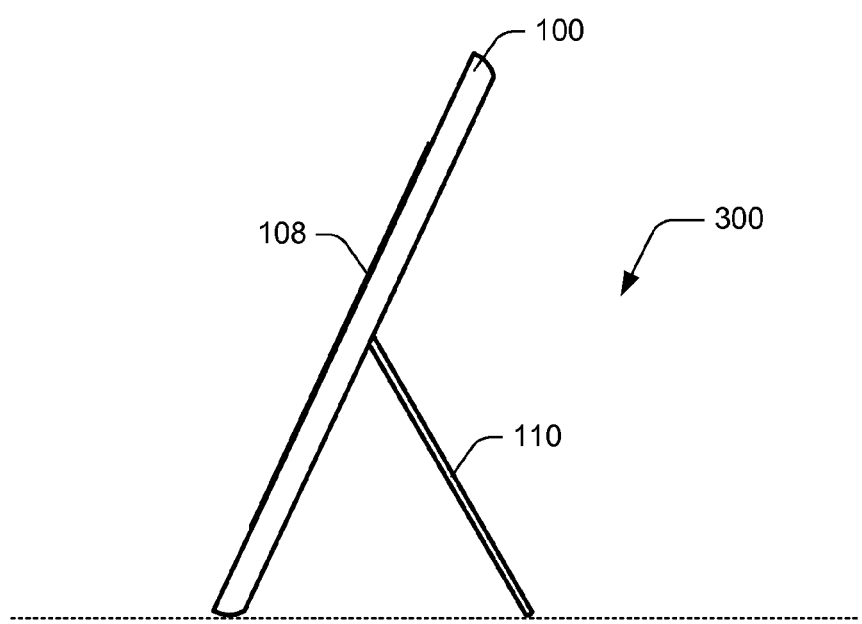
FIG. 3 depicts an example orientation a support component in an open position in accordance with one or more embodiments.

FIG. 3 illustrates a side view of the computing device 100 with an example open position 300 for the support component 110. In the position 300, the support component 110 is positioned such that the computing device 100 may be placed on a surface at an angle to permit viewing of the display device 108.

Figure 4:
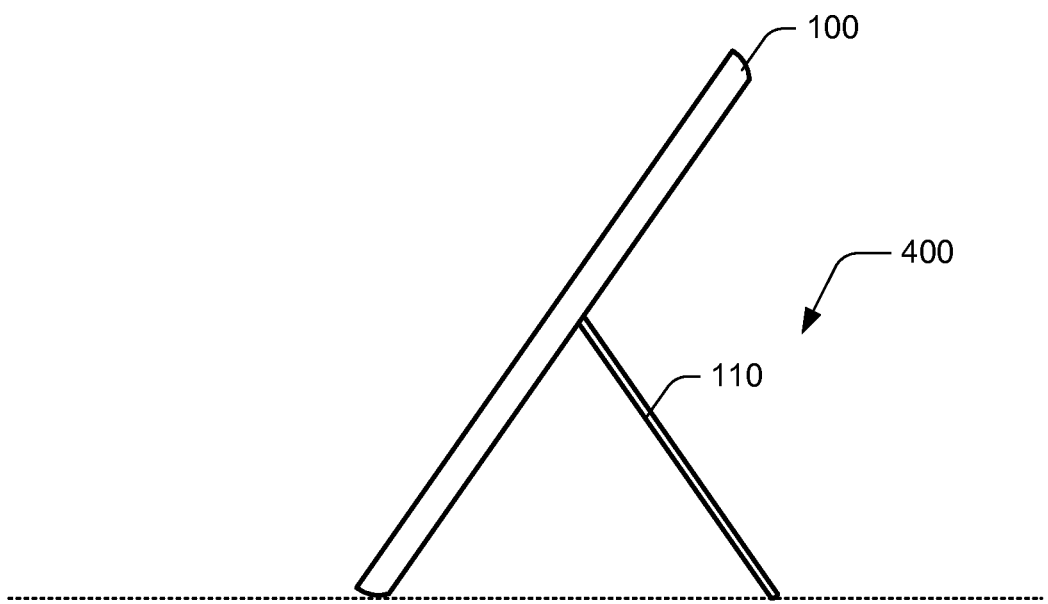
FIG. 4 depicts an example orientation a support component in an open position in accordance with one or more embodiments.

FIG. 4 illustrates a side view of another example open position 400 for the support component 110. In the position 400, the support component 110 is opened further past the position 300 illustrated in FIG. 3. As illustrated, the position 400 allows the computing device 100 to be placed on an adjacent surface at a reclined angle that is further reclined in comparison to the position 300. The position 400 supports a variety of usage scenarios for the computing device 100, such as in a user's lap (e.g., during air travel), for tall users that may have a higher viewing angle, usage on a low surface (e.g., a coffee table), and so forth.

According to various implementations, the positions 300, 400 represent preset open positions for the support component 110. For instance, when the support component 110 is opened from the closed position 200, the support component can "snap" into the open position 300. When the support component 110 is opened further past the open position 300, the support component 110 can snap into the open position 400. Thus, the support component 110 is positionable in multiple positions to enable a variety of usage scenarios via different positions of the support component 110.

Figure 5:
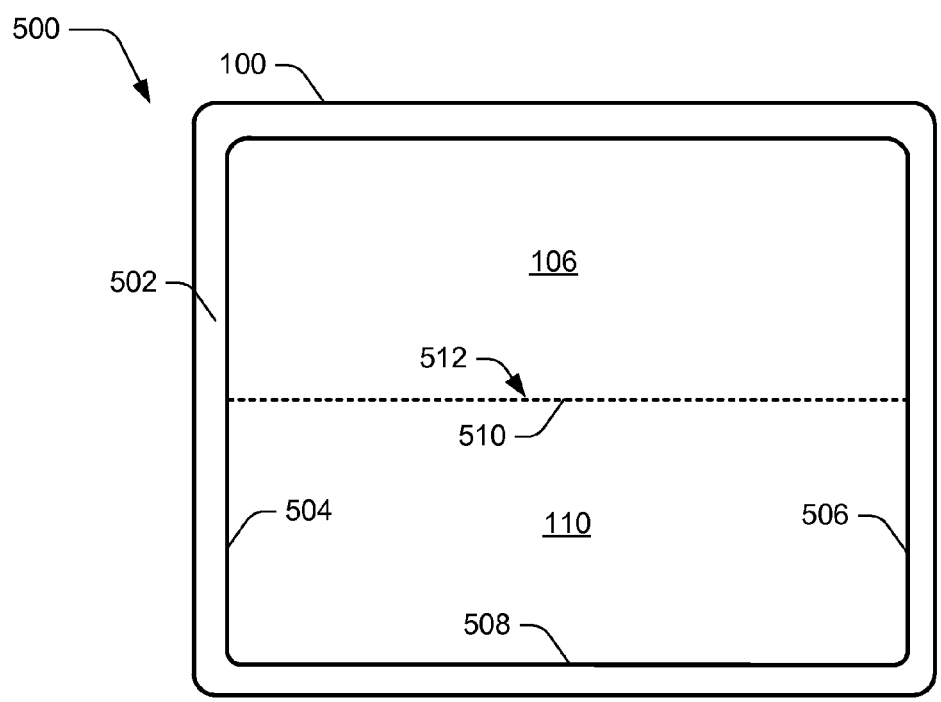
FIG. 5 depicts an example rear view of a support component in a closed position in accordance with one or more embodiments.

FIG. 5 illustrates a rear view 500 of the computing device 100 with the support component 110 in a closed position, e.g., the position 200 introduced above. In this particular implementation, the rear surface 106 has a peripheral portion 502 that forms an external border of the rear surface 106. The support component 110 includes a first side edge 504, a second side edge 506, a bottom edge 508, and a top edge 510. As illustrated, the peripheral portion 502 surrounds the first side edge 504, the second side edge 506, and the bottom edge 508. The top edge 510 represents a region where the support component 110 connects to the computing device 110.

As detailed herein, the entire rear portion of the computing device 100 is laminated with a single piece of fabric, including the rear portion 106, the peripheral portion 502, and the support component 110. The fabric is cut at the first side edge 504, the second side edge 506, and the bottom edge 508 to enable movement of the support component 110. According to one or more implementations, the fabric is not cut at the top edge 510 of the support component 110, thus providing a seamless interface between the top edge 510 and the rear portion 106 of the computing device 100. For instance, when the support component is in a closed position as illustrated here, the top edge 510 may not be visually discernable and/or visible.

In at least some implementations, the fabric may be cut at the external edges of the peripheral portion 502, e.g., around the outer periphery of the rear portion 106. Alternatively, the fabric may wrap around the external edges of the computing device 100 such that at least some portions of the front surface 104 of the computing device 100 are laminated with the fabric.

Figure 6:
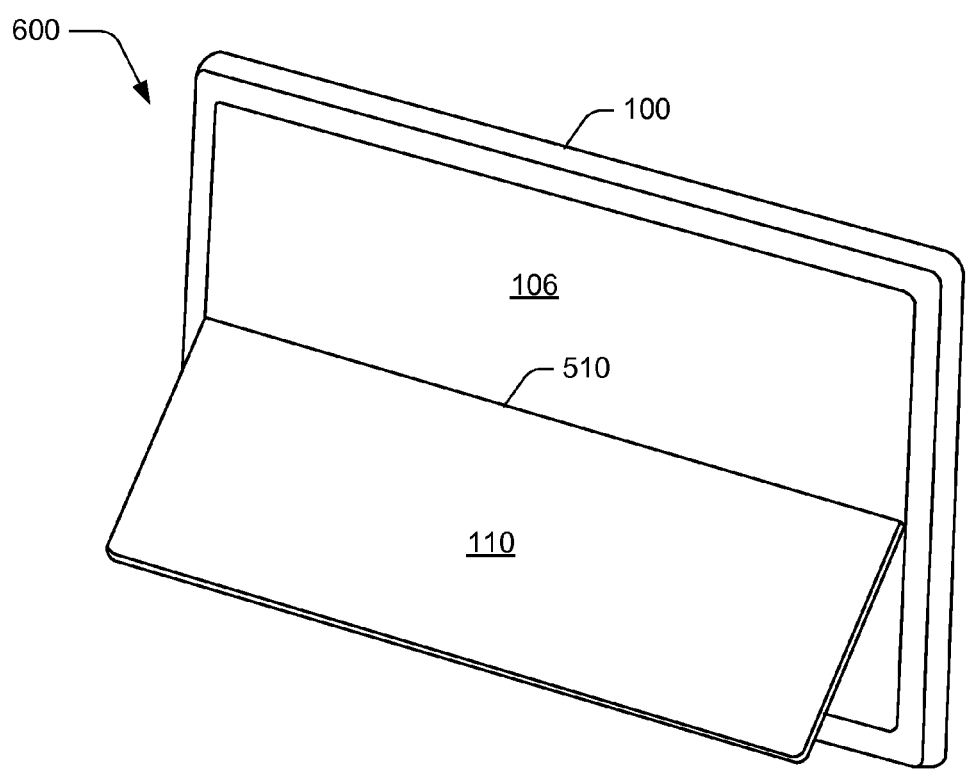
FIG. 6 depicts an example rear view of a support component in an open position in accordance with one or more embodiments.

FIG. 6 illustrates a rear view 600 of the computing device 100 with the support component 110 in an open position, e.g., one of the open positions 300, 400 discussed above. The rear view 600 illustrates that when the support component 110 is open, the top edge 510 may be visually discernable since the fabric coating on the rear surface bends to accommodate movement of the support component 110. In at least some implementations, the top edge 510 itself may not be visible since it is covered by fabric, but the seam between the top edge 510 and the rear surface 106 may be visually discernable when the support component 110 is in an open position.

Figure 7:
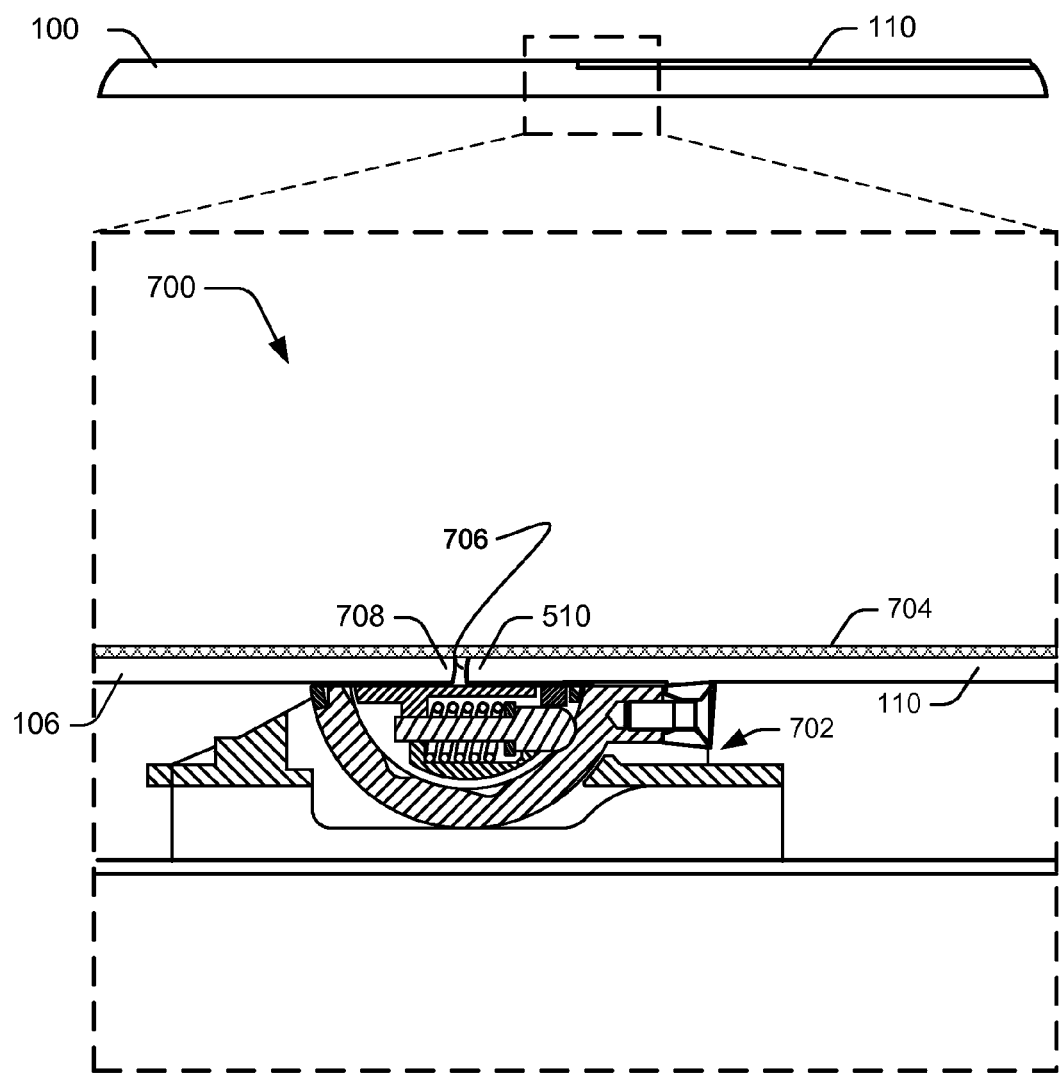
FIG. 7 depicts an example side view of a computing device with a support component in a closed position in accordance with one or more embodiments.

FIG. 7 illustrates a side cutaway view 700 of a portion of the computing device 100 with the support component 110 in a closed position in accordance with one or more implementations. The cutaway view 700 illustrates that the support component 110 is movably attached to the computing device 100 via a hinge mechanism 702. Further illustrated is a portion of an outer fabric layer 704 that is laminated to the rear surface 106 and the support component 110. In at least some implementations the outer fabric layer 704 is a single piece of fabric that is laminated to the back of the computing device 100.

As illustrated here, the outer fabric layer 704 covers a seam 706 that occurs between the top edge 510 of the support component 110, and an adjacent abutting edge 708 of the rear surface 106. Thus, in at least some implementations, the seam 706 is not visible and/or visually discernable when the support component 110 is in a closed position.

Figure 8:
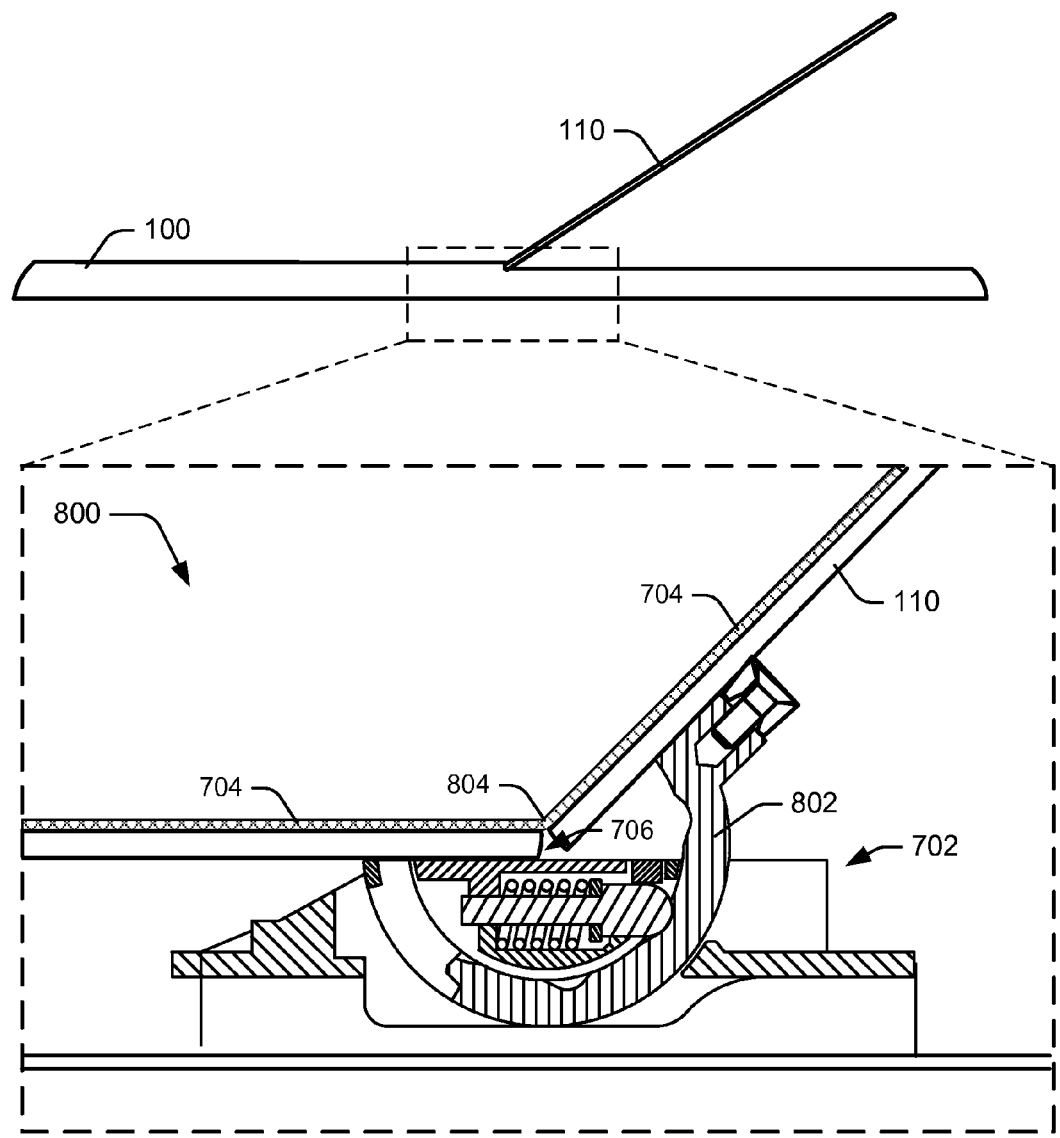
FIG. 8 depicts an example side view of a computing device with a support component in an open position in accordance with one or more embodiments.

FIG. 8 illustrates a side cutaway view 800 of the computing device 100 with the support component 110 in an open position in accordance with one or more implementations. The cutaway view 800 illustrates that the support component 110 is attached to the hinge mechanism 702 via a hinge ring 802 which is rotatably and/or movably positioned within the body of the hinge mechanism 702. Generally, movement of the hinge ring 802 within the hinge mechanism 702 enables the support component 110 to be placed in various positions relative to the computing device 100.

The cutaway view 800 further illustrates that when the support component 110 is opened, the outer fabric layer 704 deforms to allow movement of the support component 110. In at least some implementations, the hinge mechanism 702 is configured with a center of rotation 804 that coincides with a position on the surface of the outer fabric layer 704 that is coplanar with a vertical plane that passes through the seam 706. The center of rotation 804 is external to the hinge mechanism 702, and thus enables compact movement of the support component 110. Accordingly, the outer fabric layer 704 may bend when the support component 110 is moved between different positions without causing stretching of the outer fabric layer 704 during movement of the support component 110.

In at least some implementations, the hinge mechanism 702 includes preset stop positions that correspond to preset open positions for the support component 110. The hinge ring 802, for example, may include detents that cause the hinge mechanism 702 to snap into one or more open positions. Alternatively or additionally, the hinge mechanism 702 may be implemented as a friction hinge (e.g., a constant torque hinge) that can assume multiple different open positions for device operation. For instance, in a friction hinge scenario, the hinge mechanism 702 may be placed in different open positions that are separated by a few degrees, e.g., five degrees or less relative to the chassis of the computing device 100. At least some implementations may utilize a combination of detent settings and friction hinge such that the hinge mechanism 702 may have one or more preset detent open positions, and may enable frictional positioning of the support component 110 at multiple positions between the preset open positions. Thus, in different implementations, the hinge mechanism 702 provides for a variety of positions for the support component 110 to support a variety of different operating scenarios.

Example Fabrication Scenarios

This section discusses some example scenarios for fabrication of various components and aspects of the computing device 100.

Figure 9:
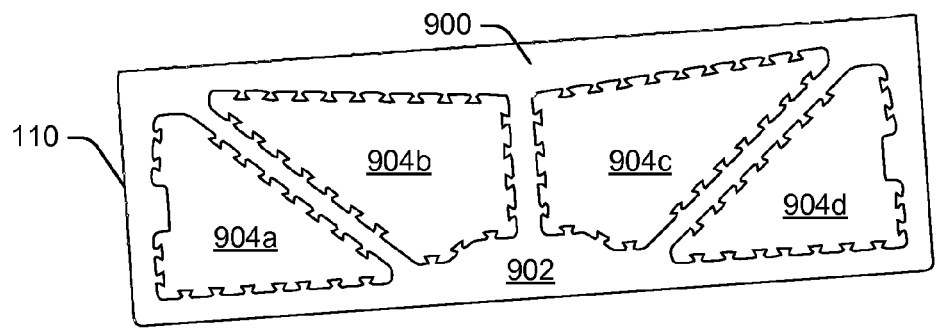
FIG. 9 depicts an example view of a support component in accordance with one or more embodiments.

FIG. 9 illustrates an inner surface 900 of the support component 110 prior to being laminated with fabric. The inner surface 900 includes a support body 902 with cutout portions 904a, 904b, 904c, and 904d. In at least some implementations, the support body 902 represents a main body of the support component that is formed from a particular material, such as a metal, alloy, plastic, and so forth. The cutout portions 904a-904d represent portions of the support body that are removed. The cutout portions 904a-904d may be removed using various techniques, such as laser cutting, die cutting, punching, chemical etching, and so forth.

According to one or more implementations, the cutout portions 904a-904d are filled with a material that is different than the material used to form the support body 902. For instance, the cutout portions 904a-904d are filled with a material that is lighter than the material used to form the support body 902. Examples of materials that may be used to fill the cutout portions 904a-904d include plastics, carbon fiber composites, glass fiber materials, and so forth. This enables the weight of the support component 110 to be reduced while maintaining rigidity of the support component 110.

Figure 10:
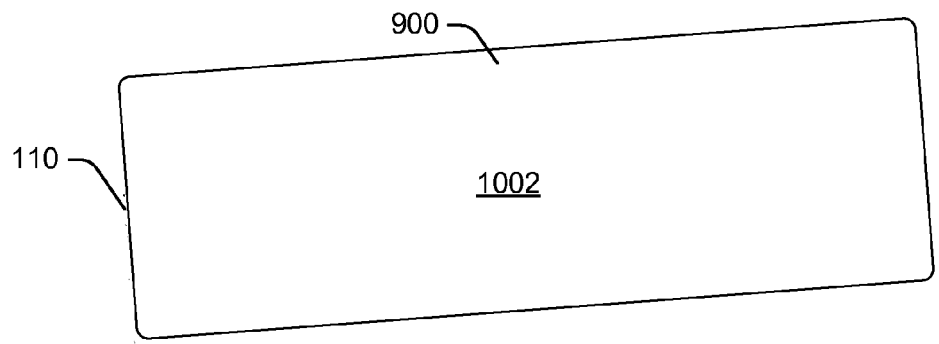
FIG. 10 depicts an example view of a support component laminated with an inner fabric layer in accordance with one or more embodiments.

FIG. 10 illustrates the inner surface 900 of the support component 110 after being laminated with an inner fabric layer 1002. Generally, the inner fabric layer 1002 represents a different fabric layer than the outer fabric layer 704. According to one or more implementations, the inner fabric layer 1002 may be formed from the same type of fabric as the outer fabric layer 704, or a different type of fabric. The inner fabric layer 1002 may be laminated to the inner surface 900 using one or more different techniques, such as adhesive, thermal lamination, mechanical attachment, and so forth.

Figure 11:
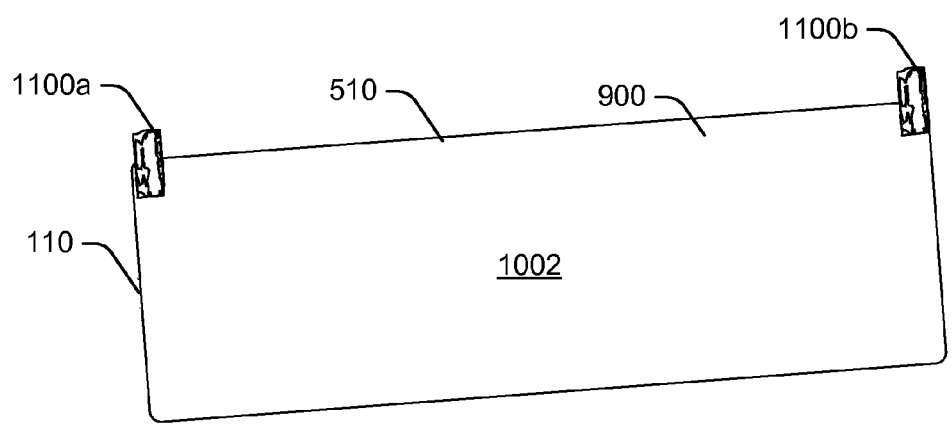
FIG. 11 depicts an example view of a support component with hinge mounts attached in accordance with one or more embodiments.

FIG. 11 illustrates the inner surface 900 of the support component 110 after being laminated with the inner fabric layer 1002 and with hinge rings 1100a, 1100b installed along the top edge 510. Generally, the hinge rings 1100a, 1100b represent implementations of the hinge ring 802 introduced above. The hinge rings 1100a, 1100b can be attached to the inner surface 900 utilizing any suitable attachment technique, such as using rivets, screws, adhesives, and so forth. Thus, according to at least some implementations, the hinge rings 1100a, 1100b are attached after the inner fabric layer 1002 has been laminated to the inner surface 900. As further detailed below, the hinge rings 1100a, 1100b may be inserted into a main body of a hinge mechanism to enable attachment of the support component 110 to an associated apparatus.

While this particular implementation scenario illustrates that the inner fabric layer 1002 is applied before the hinge rings 1100a, 110b, it is to be appreciated that in at least some implementations, the hinge rings 1100a, 110b may be attached before the inner fabric layer 1002 is applied.

Figure 12:
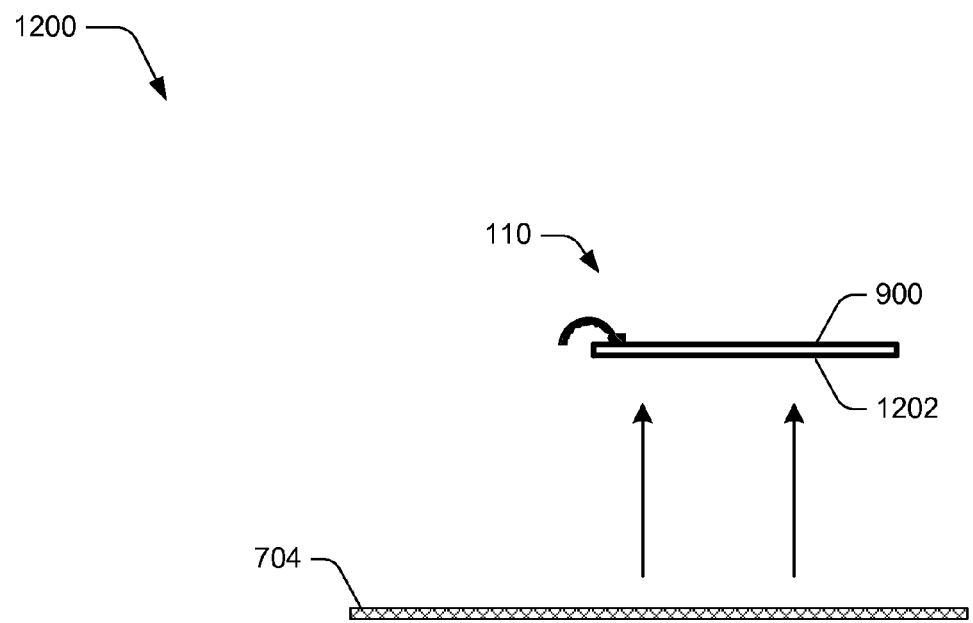
FIG. 12 illustrates an implementation scenario for laminating an outer fabric layer to an outer surface of a support component in accordance with one or more embodiments.
Figure 12:
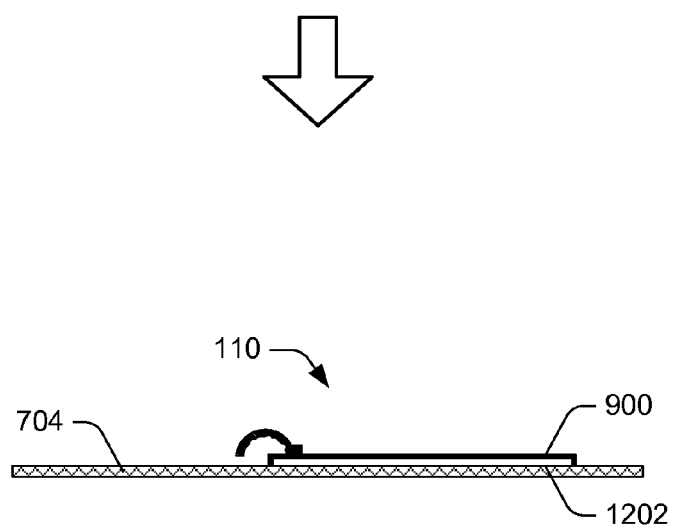

FIG. 12 illustrates an implementation scenario 1200 for laminating the outer fabric layer 704 onto an outer surface 1202 of the support component 110. According to one or more implementations, the scenario 1200 occurs subsequently to lamination of the inner fabric layer 1002 to the inner surface 900 and attachment of the hinge rings 1100a, 1100b.

In the upper portion of the scenario 1200, the support component 110 and the outer fabric layer 704 are illustrated. Proceeding to the lower portion of the scenario 1200, the outer fabric layer 704 is laminated to the outer surface 1202 of the support component 110. The outer fabric layer 704 may be laminated to the outer surface 1202 using any suitable lamination technique, examples of which are discussed elsewhere herein.

Figure 13:
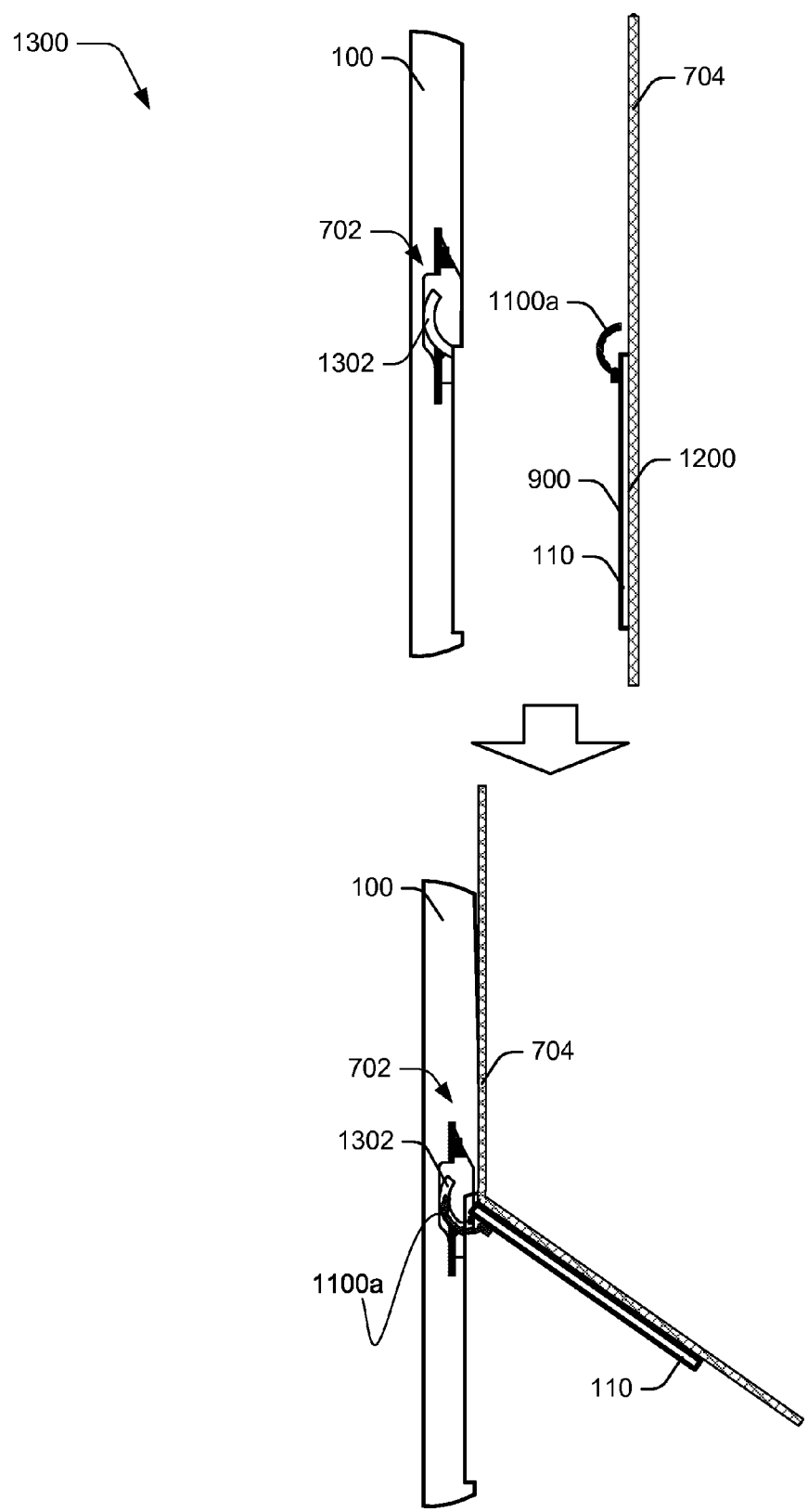
FIG. 13 illustrates an implementation scenario for attaching a support component to a computing device in accordance with one or more embodiments.

FIG. 13 illustrates an implementation scenario 1300 for attaching the support component 110 to the computing device 100. In at least some implementations, the scenario 1300 occurs subsequently to the scenario 1200 discussed above.

The scenario 1300 includes a side cutaway view of the computing device 100 with the hinge mechanism 702, introduced above. The hinge mechanism 702 includes a mounting channel 1302. For ease of illustration, other components of the computing device 100 and the hinge mechanism 702 are not illustrated. The scenario 1300 further includes the outer fabric layer 704 laminated to the outer surface 1200 of the support component 110, and the hinge ring 1100a mounted to the inner surface 900 of the support component 110.

Proceeding to the lower portion of the scenario 1300, the support component 110 is mounted to the computing device 100 via insertion of the hinge ring 1100a into the mounting channel 1302. Generally, the mounting channel 1302 represents a curved channel within the hinge mechanism 702 in which the hinge ring 1100a may be movably mounted. For instance, movable interaction between the hinge ring 1100a and the mounting channel 1302 enables the support component 110 to be moved between different positions, examples of which are discussed above.

According to the scenario 1300, the outer fabric layer 704 is flexible and thus supports manipulation of the support component 110 to enable the hinge ring 1100a to be "hooked into" the mounting channel 1302.

While the scenario 1300 is discussed with reference to a single hinge ring 1100a being mounted with a single hinge mechanism 702, it is to be appreciated that multiple hinge rings (e.g., two or more) may be mounted on the support component 110 and multiple hinge mechanisms 702 may be mounted on the computing device 100. Thus, the scenario 1300 may be performed to insert (e.g., simultaneously and/or concurrently) multiple hinge rings into multiple hinge mechanisms to enable attachment of the support component 110 to the computing device 100.

Figure 14:
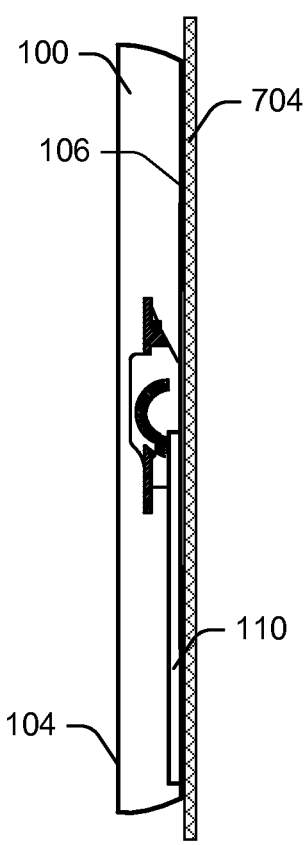
FIG. 14 illustrates an implementation scenario for laminating an outer fabric layer to a rear surface of a computing device in accordance with one or more embodiments.

FIG. 14 illustrates a scenario 1400 where the outer fabric layer 704 is laminated to the rear surface 106 of the computing device 100 in accordance with one or more implementations. The scenario 1400 includes a side cutaway view of the computing device 100. In at least some implementations, lamination of the outer fabric layer 704 to the rear surface 106 of the computing device 100 occurs subsequently to the scenario 1300 discussed above, e.g., subsequently to the support component 110 being attached to the computing device 100.

As illustrated in FIG. 14, the portion of fabric used to form the outer fabric layer 704 is larger than the back of the computing device 100 when the fabric is initially laminated onto the back of the computing device 100. Thus, as discussed below, the fabric may be trimmed around the peripheral edges of the back surface of the computing device 100. Alternatively, the outer fabric layer 704 may be wrapped and laminated to the side peripheral edges of the computing device 100 and optionally to cover portions of the front surface 104 of the computing device. For instance, in at least some implementations, all external surfaces of the computing device 100 can be wrapped in fabric (e.g., the outer fabric layer 704) with the exception of the display device 108, connection ports on the external surface of the computing device 100, and/or other protrusions from and/or cavities in the external surface of the computing device 100.

Figure 15:
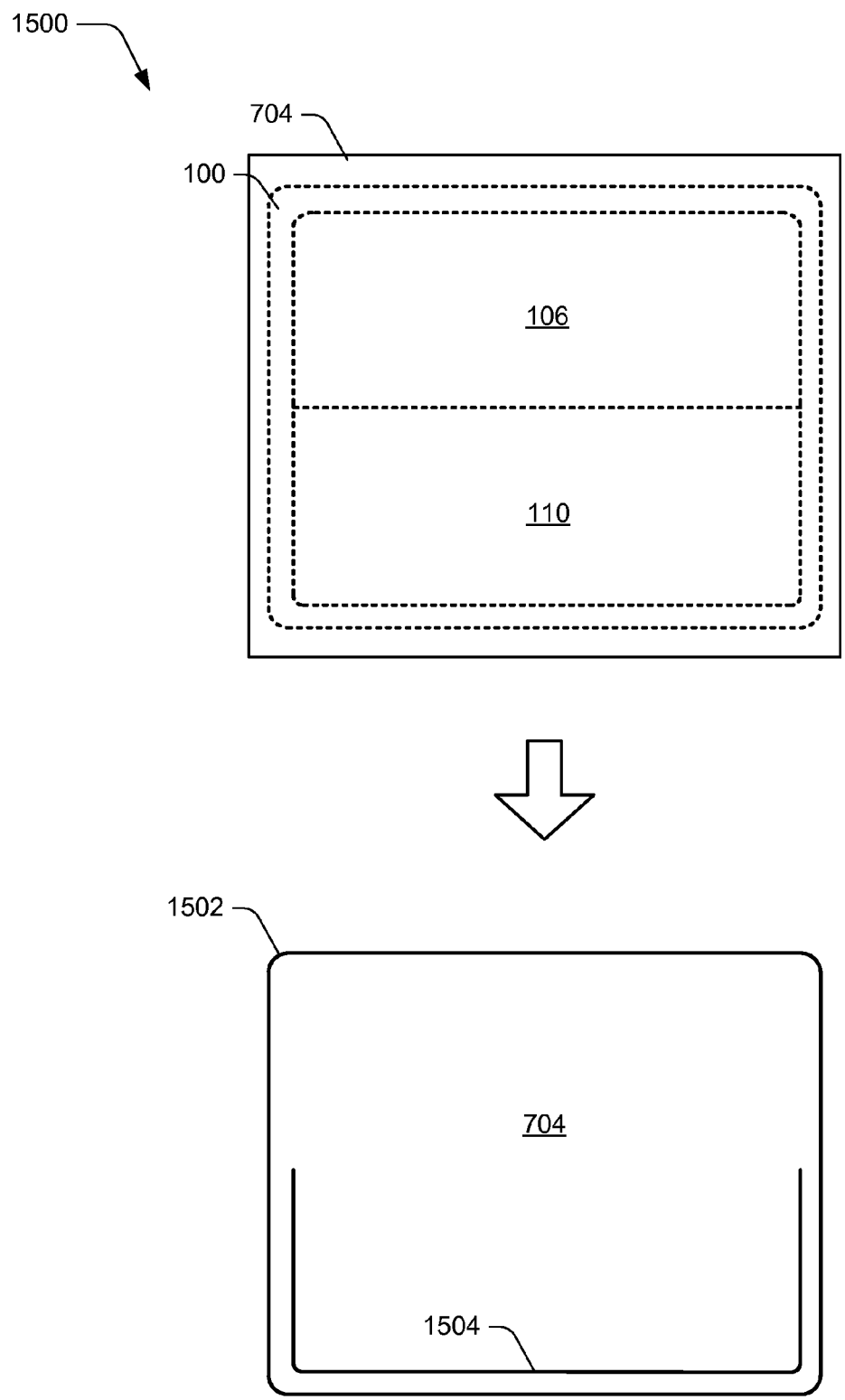
FIG. 15 illustrates an implementation scenario for trimming an outer fabric layer in accordance with one or more embodiments.

FIG. 15 illustrates a scenario 1500 for trimming the outer fabric layer 704 in accordance with one or more implementations. In at least some implementations, the scenario 1500 may occur subsequent to the scenario 1400 discussed above.

The upper portion of the scenario 1500 illustrates a view facing the outer fabric layer 704 laminated to the rear surface 106 and the support component 110 of the computing device 100. The rear surface 106 and the support component 110 may not actually be visible through the outer fabric layer 704, but their outlines are presented to aid in understanding. This is not intended to be limiting, however, and in at least some implementations the outer fabric layer 704 may be semi-transparent or transparent, and thus the rear surface 106 and/or the support component 110 may be visible through the outer fabric layer 704.

Proceeding to the lower portion of the scenario 1500, the periphery of the outer fabric layer 704 is trimmed according to an outer profile 1502. For example, portions of the outer fabric layer that extend beyond the outer edge of the computing device 100 are trimmed. The outer profile 1502, for instance, corresponds to an outer border and/or edge of the computing device 100. In at least some implementations, the outer profile 1502 corresponds to an object profile that is generated for the computing device 100 based on detected peripheral dimensions of the computing device 100. An object profile, for instance, is representative of data that describes dimensions and/or other physical attributes of the computing device 102. For example, the object profile can include data points that describe the relative position of the peripheral surface of the computing device 100 in a coordinate space. In this particular example, the object profile may describe the dimensions and relative positions of the peripheral edge of the chassis of the computing device 100, e.g., the physical outline of the computing device 100.

The lower portion of the scenario 1500 further illustrates that a release cut 1504 is cut into the outer fabric layer 704. Generally, the release cut 1504 represents a "U" shaped cut that is cut according to the profile of the left edge, right edge, and bottom edge of the support component 110. The release cut 1504, for instance, enables the support component 110 to be opened from a closed position to one or more open positions. Notice that the release cut 1504 does not include a cut along the top edge of the support component 110. Thus, as discussed above, a seam between the support component 110 and the rear surface 106 may not be visible or visually discernable when the support component 110 is closed.

According to one or more implementations, the outer profile 1502 and the release cut 1504 may be cut using any suitable technique, such as laser cutting, machine cutting, heat cutting, and so forth.

Thus, as discussed and illustrated with reference to the implementations herein, a permanent fabric layer can be laminated to portions of an apparatus. The outer fabric layer 704, for instance, is not removable once laminated to the computing device 100, and thus is different and distinct from a removable cover. Thus, techniques provide a single integrated apparatus including a fabric layer laminated to one or more outer surfaces of the apparatus. This provides a variety of benefits over a removable cover, including those of a low profile fabric layer that is lighter than a typical removable cover.

In at least some implementations, the scenarios discussed with reference to FIGS. 9-15 represent a sequential fabrication process that may be performed to produce different instances and implementations of an apparatus according to techniques for fabric lamination to a component.

Having discussed some example implementation scenarios for fabric lamination to a component, consider now some example procedures in accordance with one or more implementations.

Example Procedures

The following discussion describes some example procedures for fabric lamination to a component in accordance with one or more implementations. The example procedures may be employed in the system 2300 of FIG. 23, and/or any other suitable environment. In at least some implementations, the procedures may be partially or wholly performed via automated processes, e.g., fabrication and/or manufacturing processes. The procedures, for instance, describe example methods for performing various aspects of the scenarios discussed above.

The procedures are discussed with reference to a "moveable component," which in at least some implementations may be implemented as the support component 110 discussed above. This is not intended to be limiting, however, the moveable component may represent any component that is moveable relative to an apparatus to which the component is attached.

Figure 16:
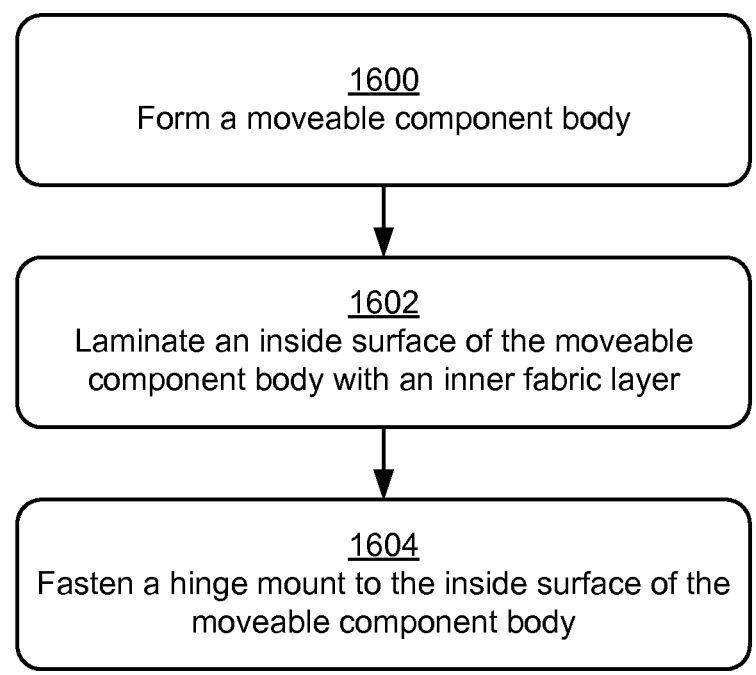
FIG. 16 is a flow diagram that describes steps in a method for moveable component fabrication in accordance with one or more embodiments.

FIG. 16 is a flow diagram that describes steps in a method in accordance with one or more implementations. The method generally describes an example implementation for moveable component fabrication.

Step 1600 forms a moveable component body. The moveable component body can be formed utilizing any suitable technique, such as machining, stamping, chemical etching, laser ablation, and so forth. As discussed above, the moveable component body may have cutout portions that can be filled with one or more filler materials, such as to reduce the weight and/or increase the rigidity of the moveable component body.

Step 1602 laminates an inside surface of the moveable component body with an inner fabric layer. Any suitable fabric material and lamination technique may be utilized, examples of which are discussed above.

Step 1604 fastens a hinge mount to the inside surface of the moveable component body. Generally, a hinge mount provides a mechanism for moveably attaching the moveable component body to a hinge mechanism. Examples of a hinge mount include the example hinge rings discussed above.

While a single hinge mount is discussed in this example method, it is to be appreciated that any suitable number of hinge mounts can be employed in accordance with various implementations. For instance, the computing device 100 discussed above may include multiple hinge mechanisms, and thus multiple corresponding hinge mounts may be attached to an associated moveable component.

Further, while this example procedure discusses that an inside surface of a moveable component body is laminated with an inner fabric layer before a hinge mount is attached, it is to be appreciated that in at least some implementations, the hinge mount may be attached before the inner fabric layer is applied.

Figure 17:
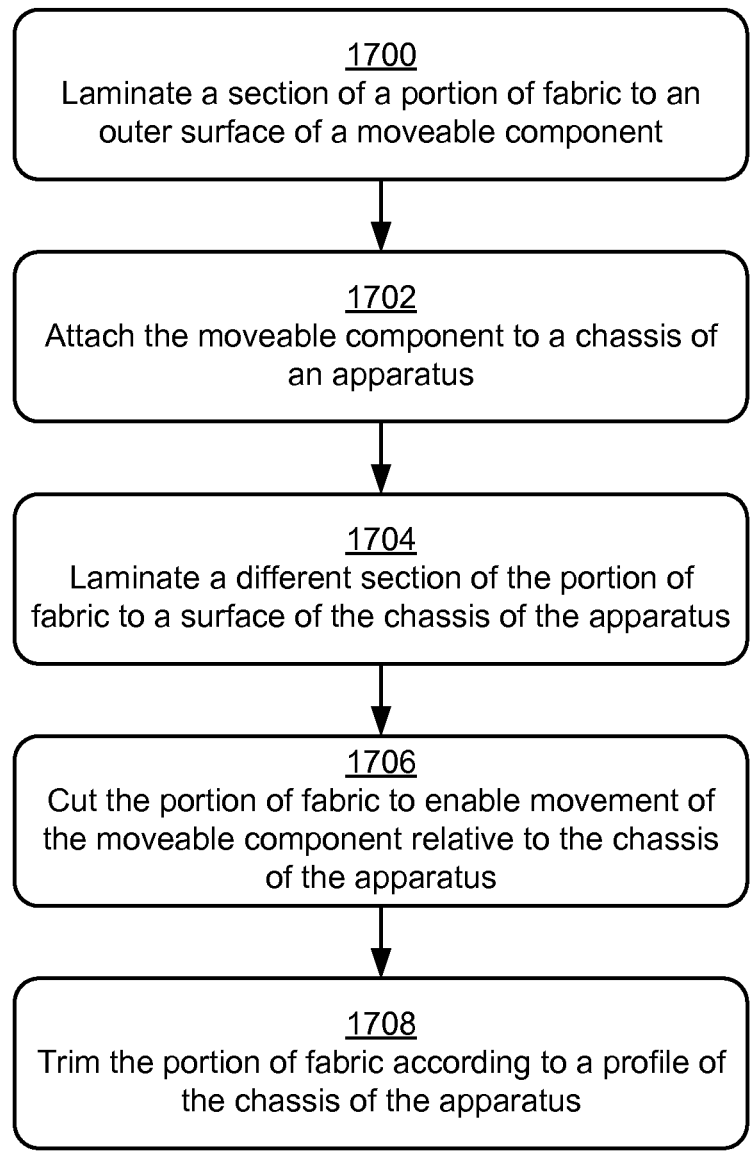
FIG. 17 is a flow diagram that describes steps in a method for mounting a moveable component and laminating an outer fabric layer in accordance with one or more embodiments.

FIG. 17 is a flow diagram that describes steps in a method in accordance with one or more implementations. The method generally describes an example implementation for mounting a moveable component and laminating an outer fabric layer. In at least some implementations, the method describes an example extension of the method described above with reference to FIG. 16.

Step 1700 laminates a section of a portion of fabric to an outer surface of a moveable component. Any suitable fabric type and lamination technique may be utilized, examples of which are discussed above.

Step 1702 attaches the moveable component to a chassis of an apparatus. As detailed above, the moveable component may be attached to a hinge mechanism of the apparatus to enable movement of the moveable component relative to a chassis of the apparatus. The computing device 100 introduced above is one example of an apparatus to which a moveable component may be attached.

Step 1704 laminates a different section of the portion of fabric to a surface of the chassis of the apparatus. For instance, the portion of fabric may be laminated to one and/or multiple surfaces of the apparatus. With reference to the computing device 100, for example, the portion of fabric may be mounted to a rear surface, side surfaces (e.g., edges), and/or portions of its front surface. Any suitable lamination technique may be utilized, examples of which are discussed above.

Step 1706 cuts the portion of fabric to enable movement of the moveable component relative to the chassis of the apparatus. For instance, the fabric may be cut according to a profile of one or more edges of the moveable component to enable the moveable component to be opened relative to the chassis. An example of such a cut is discussed above with reference to FIG. 15.

Step 1708 trims the portion of fabric according to a profile of the chassis of the apparatus. As discussed above, the portion of fabric may be larger than a surface of an apparatus to which the fabric is laminated. Thus, the fabric may be trimmed to match various surface aspects of the apparatus, such as to match a peripheral profile of the chassis of the apparatus. An example way of trimming a portion of fabric according to an apparatus profile is discussed below.

In an alternative embodiment, the portion of fabric may be wrapped around the edges of the apparatus such that the fabric is laminated to at least a portion of another surface of the apparatus, e.g., edges and/or a front surface of the chassis. Thus, in such an alternative embodiment, the portion of fabric may not be cut to a peripheral profile of the apparatus.

Figure 18:
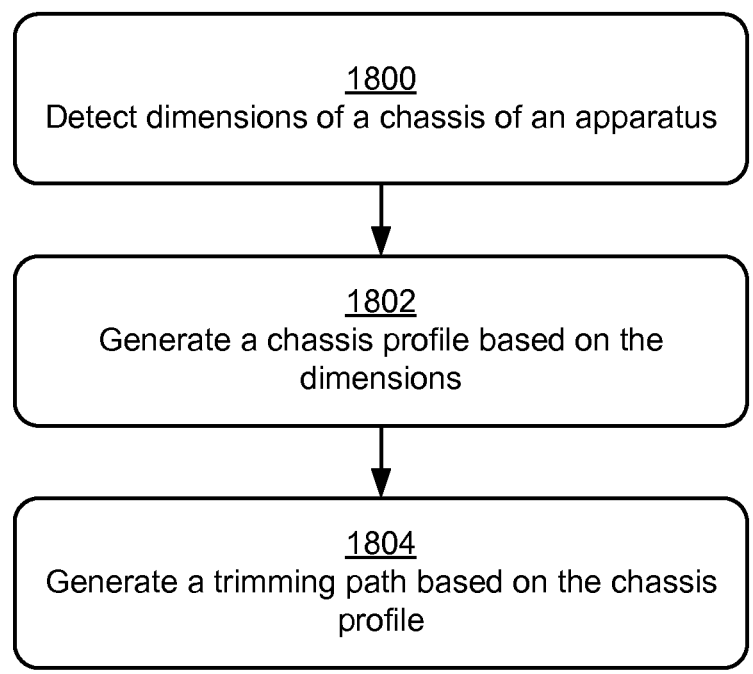
FIG. 18 is a flow diagram that describes steps in a method for enabling a portion of fabric to be trimmed according to a particular profile in accordance with one or more embodiments.

FIG. 18 is a flow diagram that describes steps in a method in accordance with one or more implementations. The method generally describes an example implementation for enabling a portion of fabric to be trimmed according to a particular profile. With reference to the procedures discussed above, the method may be performed prior to attaching a moveable component to a chassis, e.g., prior to the method discussed above with reference to FIG. 17. In at least some implementations, the method may be performed on a "per-piece" basis as part of a manufacturing and/or fabrication process.

Step 1800 detects dimensions of a chassis of an apparatus. For instance, dimensions of an apparatus can be measured, such as height, width, thickness, corner angles, and so on. In at least some implementations, a sensing device can utilize a contact probe that contacts the surface of the apparatus, and that moves around the surface to detect its dimensions and/or other surface characteristics. For instance, the sensing device can detect positions of points on the surface of the apparatus relative to a reference coordinate space utilized by the sensing device.

Another technique that can be employed by the sensing device is laser scanning, which can detect dimensions of the apparatus. These are but two examples, and a variety of other sensing techniques may be employed in accordance with the claimed implementations.

Step 1802 generates a chassis profile based on the dimensions. For instance, data points can be generated that correspond to points on and/or portions of surfaces of the chassis. The data points can be connected in various ways to generate a data representation of a physical profile of the chassis, such as a profile of peripheral edges of the chassis.

Step 1804 generates a trimming path based on the chassis profile. For instance, the trimming path can correspond to spatial coordinates defined by the chassis profile. Alternatively or additionally, the chassis profile can be manipulated in various ways to determine the trimming path. For instance, the chassis profile can be reduced and/or enlarged in size by a particular percentage to produce the trimming path. Generally, the trimming path provides a cutting pattern that can be used by a cutting apparatus to cut a material.

In at least some implementations, the trimming path can be based on a predetermined trimming pattern that can be adjusted based on the chassis profile. The predetermining trimming pattern, for instance, can be generated (e.g., via user input) to correspond to particular features, such as based on surface features of the chassis.

According to various implementations, the trimming path may be used to trim a portion of material, such as described in step 1708 discussed above with reference to FIG. 17.

In at least some implementations, the scenarios, procedures, and methods described above can be implemented as automated processes that are performed via various algorithms that are executed to control machinery to perform particular operations.

While the scenarios, procedures, and methods discussed herein are discussed with reference to a support component of a computing device, it is to be appreciated that the techniques can be employed for moveable components in a wide variety of different implementations. For instance, the techniques can be employed to laminate fabric to moveable components and chassis of a variety of different apparatus. Consider, for example, a moveable component of wearable glasses, such as hinges and temples of a pair of smart glasses. Techniques discussed herein may be used to laminate portions (e.g., inner and/or outer surfaces) of the hinges and temples with fabric, such as to increase comfort of the glasses.

As another example, consider a smart watch that includes a movable component, such as a clasp and/or moveable cover. Techniques discussed herein may be used to laminate portions (e.g., inner and/or outer surfaces) of the clasp and/or moveable cover with fabric, such as to increase comfort of the smart watch.

These examples are provided for purpose of example only, and it is to be appreciated that techniques discussed herein may be employed in a variety of other scenarios within the spirit and scope of the discussed implementations.

Having discussed some example procedures for fabric lamination to a component, consider now some example implementations for cutting fabric around a component in accordance with one or more implementations.

Surface Components

According to one or more implementations, the computing device 100 may include various surface components on a fabric laminated surface, such as input devices, connection ports, and so forth. Thus, to enable access to the surface components, a fabric layer may be trimmed around the components. Accordingly, implementations enable precision cutting of a fabric layer around a surface component.

For instance, consider an example where the computing device 100 includes a touchpad on a surface of the device that is configured to receive touch input. The surface may be laminated in fabric, and thus the fabric may be cut around the touchpad to reveal the touchpad surface while minimizing the gap between the edge of the touchpad and the edge of the fabric.

Figure 19:
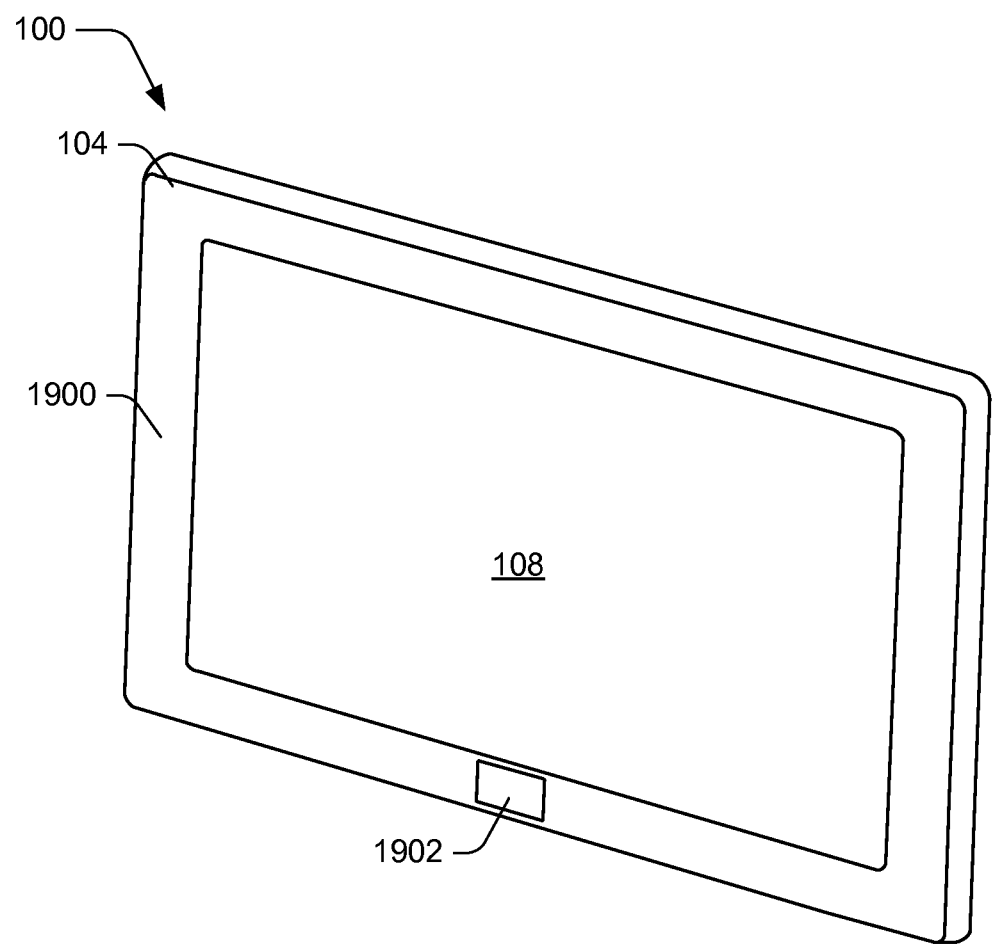
FIG. 19 depicts an example view of a computing device with a surface component in accordance with one or more embodiments.

FIG. 19 illustrates an example implementation of the computing device 100 from the perspective of the front surface 104. FIG. 19, for instance, illustrates the computing device 100 with the support component 110 in a closed position. Disposed on the front surface 104 are the display device 108 and a bezel 1900 in which a touch pad 1902 is mounted. The bezel 1902 generally represents an area of the front surface 104 that surrounds the display device 108. In at least some implementations, the display device 108 is touch-enabled and thus enables a user to provide touch input to a surface of the display device 108. The touch pad 1902 is representative of functionality separate from the display device 108 that is configured to receive touch input from a user, such as via capacitive or other sensors that are configured to detect physical touch.

According to various implementations, the bezel 1900 is laminated in fabric, such as utilizing a suitable fabric type and fabric lamination technique, examples of which are discussed above. To expose the surface of the touch pad 1902 and enable touch input to be provided to the touch pad 1902, the fabric is cut around the exterior edges of the touch pad 1902 such that the surface of the touch pad 1902 is not covered in fabric.

Figure 20:
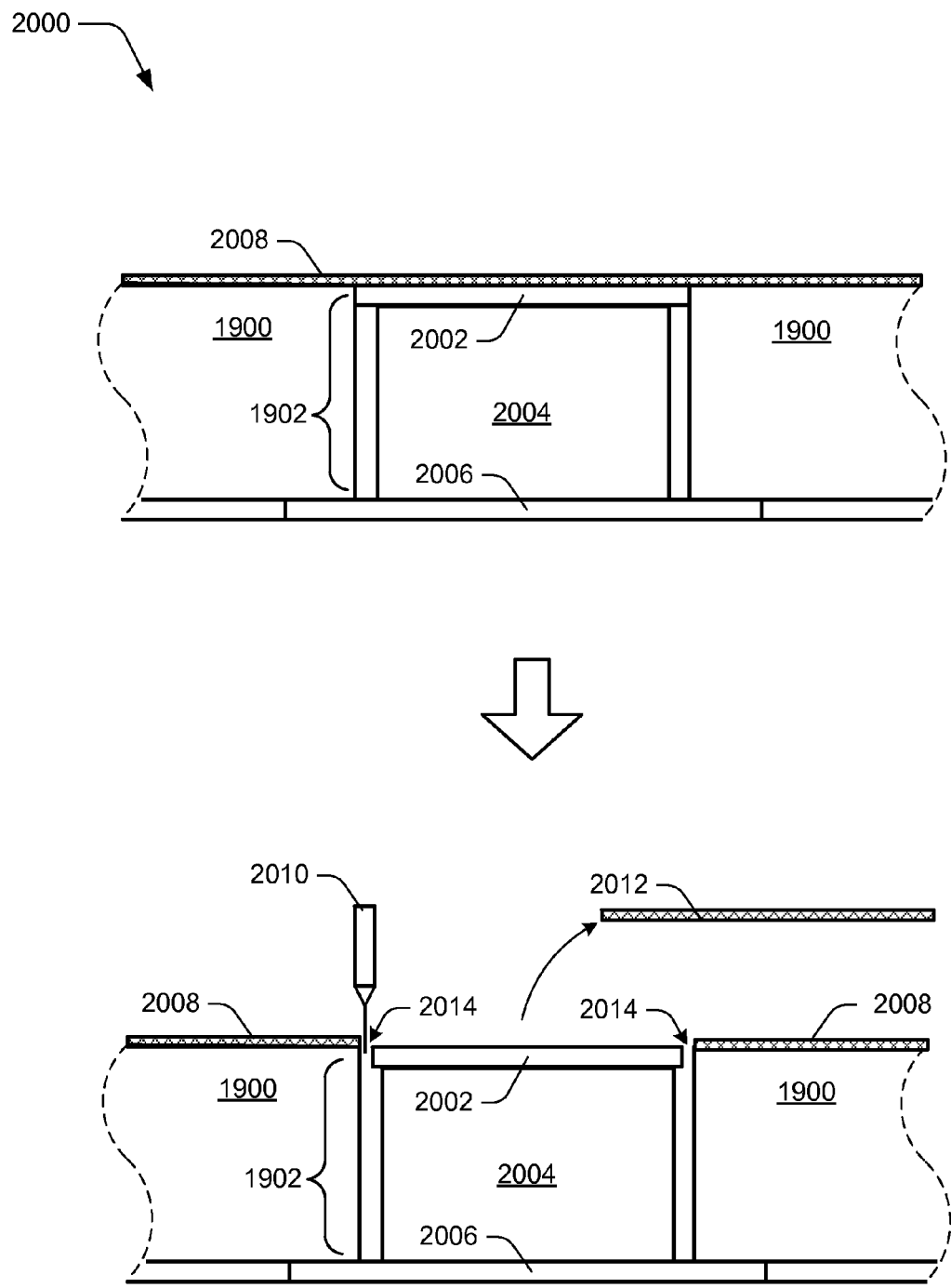
FIG. 20 illustrates an example scenario for cutting a fabric layer from around a surface component in accordance with one or more embodiments.

FIG. 20 illustrates an example scenario 2000 for cutting a fabric layer from around the touch pad 1902. Displayed in the upper portion of the scenario 2000 is a side cutaway view of the computing device 100 after the touch pad 1902 is initially installed. Further displayed are portions of the touch pad 1902, including a touch pad interface 2002, touch pad circuitry 2004, and a touch pad mounting bracket 2006 for mounting the touch pad 1902 to the chassis of the computing device 100. According to various implementations, the touch pad interface 2002 represents a surface portion of the touch pad 1902, and is configured to receive touch input from a user. The touch pad circuitry 2004 is representative of functionality to sense touch input to the touch pad interface 2002 and to transmit and/or process the touch input in various ways. For instance, the touch pad circuitry 2004 may communicate touch input to other functionalities of the computing device 100 to enable various tasks to be performed.

In the upper portion of the scenario 2000, an outer fabric layer 2008 is laminated to the surface of the bezel 1900. As illustrated, the outer fabric layer 2008 covers the touch pad interface 2002 when the fabric layer is initially laminated to the bezel 1900. According to various implementations, when the touch pad 1902 is initially installed, the touch pad interface 2002 is slightly oversized to accommodate precision cutting of the outer fabric layer 2008 around the touch pad interface 1902.

Continuing to the lower portion of the scenario 2000, a cutting tool 2010 is employed to cut the outer fabric layer 2008 around the touch pad interface 2002. Any suitable cutting tool 2010 may be utilized, such as a laser, a mechanical cutting tool, a chemical cutting tool, and so forth. Generally, the cutting tool 2010 is passed around the periphery of the touch pad interface 2002 according to a particular cutting pattern and/or cutting coordinates.

As part of the cutting, a fabric portion 2012 is removed along with a thin portion of the periphery of the touch pad interface 2002. The cutting creates a gap 2014 between the peripheral edge of the touch pad 2002 and the fabric layer 2008. Thus, the touch pad interface 2002 is exposed such that it can receive touch input from a user. Further, precision cutting enables the gap 2014 to be generated according to tight size tolerances. Accordingly, the outer fabric layer 2008 does not interfere with touch input to the touch pad interface 2002, and a user perceives a consistent gap around the touch pad interface 2002 during touch input interactions.

Figure 21:
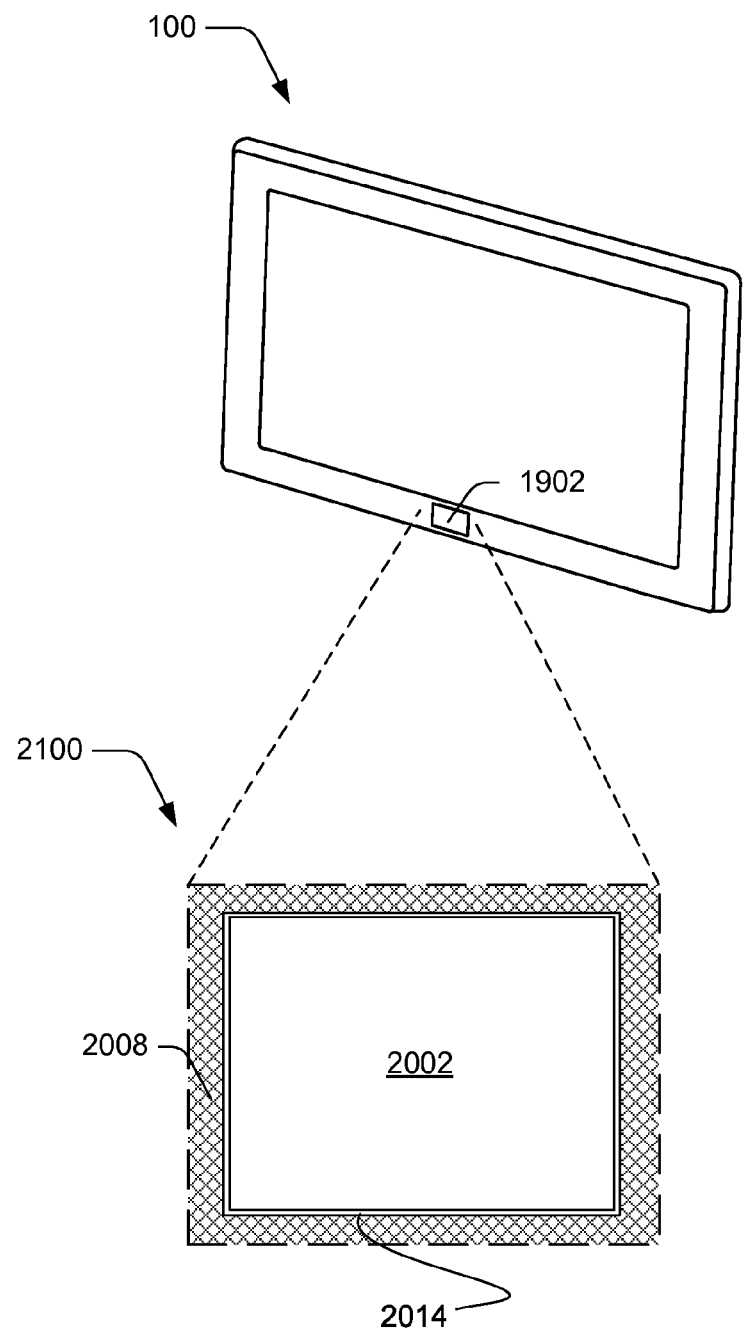
FIG. 21 depicts an enlarged view of an example component after a fabric layer is cut around the component in accordance with one or more embodiments.

FIG. 21 illustrates the computing device 100 with an enlarged view 2100 of the touch pad 1902 after the outer fabric layer 2008 is cut around the touch pad interface 2002. Notice that the gap 2014 provides a consistent space between the outer fabric layer 2008 and the periphery of the touch pad interface 2002. As mentioned above, the consistency of the gap 2014 increases the quality of the user experience when interacting with the touch pad 1902. It is to be appreciated that the gap 2014 (as well as other components and attributes) are not necessarily illustrated to scale, and may be exaggerated and/or emphasized to aid in illustration.

Figure 22:
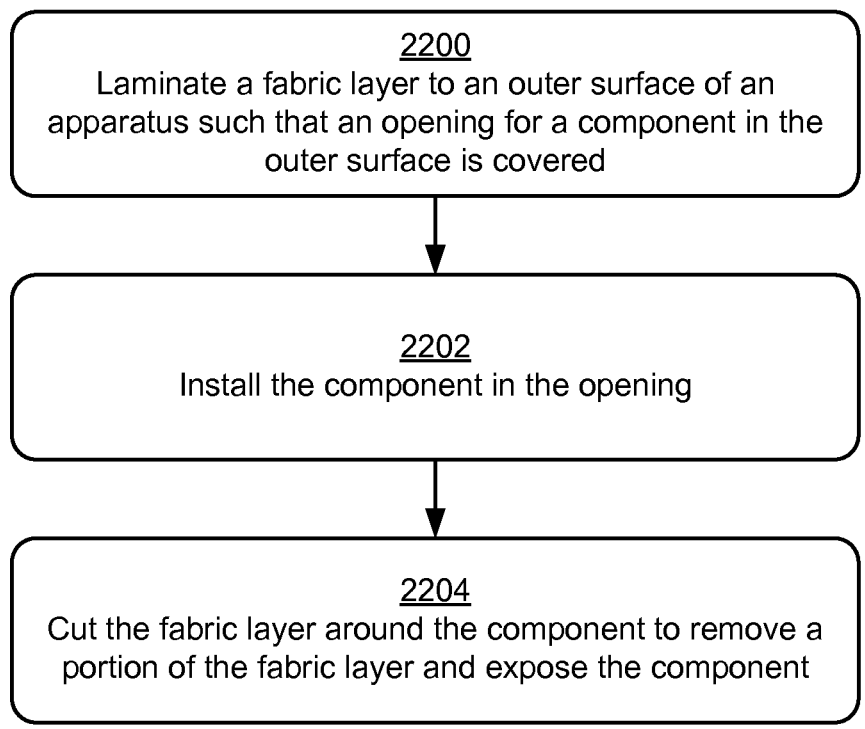
FIG. 22 is a flow diagram that describes steps in a method for cutting a fabric layer around a surface component in accordance with one or more embodiments.

FIG. 22 is a flow diagram that describes steps in a method in accordance with one or more implementations. The method generally describes an example implementation for cutting a fabric layer around a surface component.

Step 2200 laminates a fabric layer to an outer surface of an apparatus such that an opening for a component in the outer surface is covered. Any suitable fabric type and lamination technique may be utilized, examples of which are discussed above.

Step 2202 installs the component in the opening. For instance, the component can be installed from the underside of the opening, such as from the inside of a device chassis opposite the outer surface. With reference to the computing device 100, for instance, the touch pad 1902 is installed into the chassis of the computing device 100.

Step 2204 cuts the fabric layer around the component to remove a portion of the fabric layer and expose the component. For example, a cutting tool can be passed around the component opening according to a particular pattern. With reference to the touch pad 1902, for instance, the cutting tool is passed around the periphery of the touch pad interface 2002 to remove a portion of fabric and expose the touch pad interface 2002. As mentioned above, in at least some implementations, the cutting removes a thin portion of the peripheral material of the touch pad interface 2002, enabling a thin gap to be created between the outer edges of the touch pad interface 2002 and the surrounding fabric layer.

In at least some implementations, the fabric layer can be cut according to a specified pattern that is determined utilizing the method discussed above with reference to FIG. 18. For instance, the method can be utilized to detect dimensions of an opening for a component, such as relative to a chassis in which the opening resides. The dimensions can then be used to generate a cutting pattern for cutting the fabric layer around the component. Alternatively or additionally, the component itself can be scanned, and dimensions of the component can be used to generate a cutting pattern. According to one or more implementations, dimensions of an opening and/or component can be used to adjust a pre-generated cutting pattern, such as on a per-piece basis during a manufacturing and/or fabrication process.

While the implementations presented in this section are discussed with reference to a touch pad component, it is to be appreciated that implementations may be employed to cut a fabric layer around a variety of different types and instances of components.

Having discussed some example implementations for cutting fabric around a component, consider now an example system and device in accordance with one or more implementations.

Example System and Device

Figure 23:
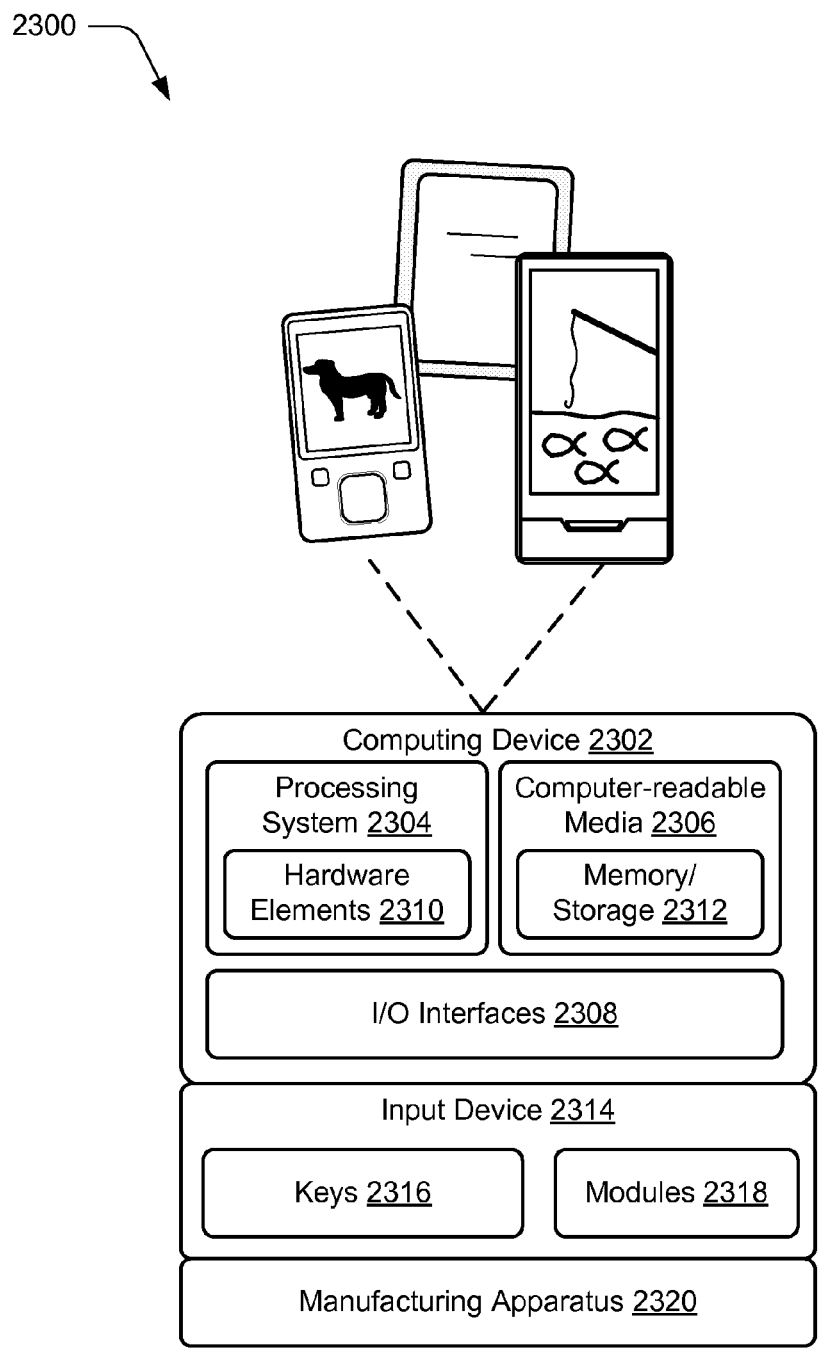
FIG. 23 illustrates an example system and device that can be employed to implement embodiments of the techniques described herein in accordance with one or more embodiments.

FIG. 23 illustrates an example system generally at 2300 that includes an example computing device 2302 that is representative of one or more computing systems and/or devices that may implement the various techniques described herein.

The example computing device 2302 as illustrated includes a processing system 2304, one or more computer-readable media 2306, and one or more I/O interface 2308 that are communicatively coupled, one to another. Although not shown, the computing device 2302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 2304 is representative of functionality to perform one or more operations using hardware. Accordingly, the processing system 2304 is illustrated as including hardware elements 2310 that may be configured as processors, functional blocks, and so forth. This may include implementation in hardware as an application specific integrated circuit or other logic device formed using one or more semiconductors. The hardware elements 2310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 2306 is illustrated as including memory/storage 2312. The memory/storage 2312 represents memory/storage capacity associated with one or more computer-readable media. The memory/storage component 2312 may include volatile media (such as random access memory (RAM)) and/or nonvolatile media (such as read only memory (ROM), Flash memory, optical disks, magnetic disks, and so forth). The memory/storage component 2312 may include fixed media (e.g., RAM, ROM, a fixed hard drive, and so on) as well as removable media (e.g., Flash memory, a removable hard drive, an optical disc, and so forth). The computer-readable media 2306 may be configured in a variety of other ways as further described below.

Input/output interface(s) 2308 are representative of functionality to allow a user to enter commands and information to computing device 2302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 2302 may be configured in a variety of ways to support user interaction.

The computing device 2302 is further illustrated as being communicatively and physically coupled to an input device 2314 that is physically and communicatively removable from the computing device 2302. In this way, a variety of different input devices may be coupled to the computing device 2302 having a wide variety of configurations to support a wide variety of functionality. In this example, the input device 2314 includes one or more keys 2316, which may be configured as pressure sensitive keys, mechanically switched keys, and so forth.

The input device 2314 is further illustrated as include one or more modules 2318 that may be configured to support a variety of functionality. The one or more modules 2318, for instance, may be configured to process analog and/or digital signals received from the keys 2316 to determine whether a keystroke was intended, determine whether an input is indicative of resting pressure, support authentication of the input device 2314 for operation with the computing device 2302, and so on.

The system 2300 further includes manufacturing apparatus 2320, which is representative of various types and/or combinations of manufacturing tools, machinery, control circuits, and so on, for implementing techniques discussed herein. Examples of the manufacturing apparatus 2320 include a stamping press, CNC mills and/or control units, cutting apparatus and/or tools, etching apparatus, casting apparatus, and so forth. In at least some implementations, the manufacturing apparatus can be controlled via portions of the computing device 2302 to implement the example procedures discussed above.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein may generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 2302. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Computer-readable storage media do not include signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 2302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 2310 and computer-readable media 2306 are representative of modules, programmable device logic and/or fixed device logic implemented in a hardware form that may be employed in some implementations to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 2310. The computing device 2302 may be configured to implement particular instructions and/or functions corresponding to the software and/or hardware modules. Accordingly, implementation of a module that is executable by the computing device 2302 as software may be achieved at least partially in hardware, e.g., through use of computer-readable storage media and/or hardware elements 2310 of the processing system 2304. The instructions and/or functions may be executable/operable by one or more articles of manufacture (for example, one or more computing devices 2302 and/or processing systems 2304) to implement techniques, modules, and examples described herein.

Example Claim Implementations

In an example implementation, a system includes a means for supporting a chassis of an apparatus on an adjacent surface at different positions relative to the adjacent surface, and means for coating the means for supporting and at least the portion of the chassis with a flexible material.

In another example implementation, a system includes a means for laminating a section of a portion of fabric to an outer surface of a moveable component; a means for attaching the moveable component to a chassis of an apparatus; a means for laminating a different section of the portion of fabric to a surface of the chassis of the apparatus that is adjacent to the moveable component; and a means for cutting the portion of fabric according to a profile of one or more edges of the moveable component to enable movement of the moveable component relative to the chassis of the apparatus.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:
1. An apparatus comprising:
a chassis with a first outer surface and a second outer surface, the second outer surface having a display device attached thereto;
a moveable component attached to the chassis adjacent to the first outer surface, the moveable component positionable in multiple positions relative to the chassis to support different viewing positions of the display device;
a single portion of fabric that is laminated to an outer surface of the moveable component and the first outer surface of the chassis, the single portion of fabric being cut to allow movement of the moveable component relative to the chassis; and the second outer surface including a bezel around the display device, the bezel being laminated with the single portion of fabric and having a component installed in an opening on the bezel adjacent the display device, the single portion of fabric being cut around the component to remove a section of the single portion of fabric and expose the component.

2. An apparatus as recited in claim 1, wherein the apparatus comprises a computing device and the moveable component comprises a support component configured to support different viewing positions of the display relative to a surface on which the apparatus is placed.

3. An apparatus as recited in claim 1, wherein the apparatus comprises a wearable computing device.

4. An apparatus as recited in claim 1, wherein the apparatus further comprises at least one hinge mechanism fastened internally to the chassis, and wherein the moveable component is attached to the at least one hinge mechanism to enable movement of the moveable component relative to the chassis.

5. An apparatus as recited in claim 1, wherein the single portion of fabric is cut along a profile of one or more edges of the moveable component to allow movement of the moveable component relative to the chassis.

6. An apparatus as recited in claim 1, wherein the moveable component is attached to the chassis along a particular edge of the moveable component, and wherein the single portion of fabric is not cut along the particular edge of the moveable component.

7. An apparatus as recited in claim 6, wherein the moveable component is attached to the chassis via a hinge mechanism, the hinge mechanism having a center of rotation that coincides with a seam between the particular edge of the moveable component and an adjacent edge of the chassis.

8. An apparatus as recited in claim 1, wherein edges of the single portion of fabric are cut according to an outer profile of the chassis.

9. A computing device comprising:
a chassis;
a display device operably attached to a first external surface of the chassis, the first external surface including a bezel around the display device;
a support component moveably attached to the chassis adjacent to a second external surface of the chassis to support different viewing positions of the display device relative to a surface on which the computing device is placed;
a single portion of fabric that is laminated to an outer surface of the support component and the second external surface, the single portion of fabric being cut to allow movement of the support component relative to the chassis; and
the bezel being laminated with the single portion of fabric and having a component installed in an opening on the bezel adjacent the display device, the single portion of fabric being cut around the component to remove a section of the single portion of fabric and expose the component.

10. A computing device as recited in claim 9, wherein the computing device comprises a tablet device, the first external surface comprises a front surface of the tablet device, and the second external surface comprises a rear surface of the computing device.

11. A computing device as recited in claim 9, further comprising at least one hinge mechanism fastened to the chassis, and wherein the support component is attached to the at least one hinge mechanism to enable movement of the support component relative to the chassis.

12. A computing device as recited in claim 9, wherein the single portion of fabric is cut along a profile of one or more edges of the support component to allow the movement of the support component relative to the chassis.

13. A computing device as recited in claim 9, wherein the support component is attached to the chassis along a particular edge of the support component, and wherein the single portion of fabric is not cut along the particular edge of the support component.

14. A computing device as recited in claim 9, wherein the second external surface comprises a rear surface of the computing device, and wherein the single portion of fabric is further cut according to an outer edge profile of the rear surface of the computing device.

15. An apparatus comprising:
a chassis with a first surface and a second surface opposite the first surface;
a display device positioned within the first surface of the chassis, the first surface including a bezel around the display device;
a support component moveably attached via a hinge mechanism to the chassis adjacent the second surface of the chassis to support different viewing positions of the display device;
a single portion of fabric including a first section that is laminated using an adhesive to an outer surface of the support component and the second surface of the chassis, the single portion of fabric being cut to allow movement of the support component relative to the chassis; and
the bezel being laminated with a second section of the single portion of fabric and having a component installed in an opening on the bezel adjacent the display device, the second section of the single portion of fabric being cut around the component to remove a portion of the second section of the single portion of fabric and expose the component.

16. An apparatus as described in claim 15, wherein the single portion of fabric is cut along a profile of one or more edges of the support component to allow the movement of the support component relative to the chassis.

17. An apparatus as described in claim 15, wherein the support component is attached to the chassis along a particular edge of the support component, and wherein the single portion of fabric is not cut along the particular edge of the support component.

18. An apparatus as described in claim 15, wherein the portion of fabric is cut according to an outer edge profile of the chassis.

19. An apparatus as described in claim 15, wherein the hinge mechanism has a center of rotation that coincides with a seam between a particular edge of the support component and an adjacent edge of the chassis.

20. An apparatus as described in claim 15, wherein the component is a touchpad that is configured to receive touch input.

* * * * *